US012707796B2

(12) United States Patent
Nagashima

(10) Patent No.: US 12,707,796 B2
(45) Date of Patent: Aug. 11, 2026

(54) IMAGING DEVICE AND IMAGING APPARATUS

(71) Applicant: SONY SEMICONDUCTOR SOLUTIONS CORPORATION, Kanagawa (JP)

(72) Inventor: Yoshito Nagashima, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 528 days.

(21) Appl. No.: 18/256,079

(22) PCT Filed: Dec. 6, 2021

(86) PCT No.: PCT/JP2021/044636

§ 371 (c)(1),
(2) Date: Jun. 6, 2023

(87) PCT Pub. No.: WO2022/131041

PCT Pub. Date: Jun. 23, 2022

(65) Prior Publication Data

US 2024/0023353 A1 Jan. 18, 2024

(30) Foreign Application Priority Data

Dec. 16, 2020 (JP) ................................. 2020-208419

(51) Int. Cl.
*H10K 39/32* (2026.01)
*H04N 25/131* (2023.01)
*H10F 39/00* (2025.01)

(52) U.S. Cl.
CPC ........... *H10K 39/32* (2023.02); *H04N 25/131* (2023.01); *H10F 39/8057* (2025.01); *H10F 39/807* (2025.01)

(58) Field of Classification Search
None
See application file for complete search history.

(56) References Cited

U.S. PATENT DOCUMENTS

2017/0040357 A1* 2/2017 Yu ....................... H10F 39/8057
2017/0170238 A1* 6/2017 Lee ....................... H10F 39/807
(Continued)

FOREIGN PATENT DOCUMENTS

JP 2015-170620 A 9/2015
JP 2017-208496 A 11/2017
(Continued)

OTHER PUBLICATIONS

International Search Report and Written Opinion of PCT Application No. PCT/JP2021/044636, issued on Feb. 1, 2022, 08 pages of ISRWO.

*Primary Examiner* — Yara B Green
*Assistant Examiner* — Coralie A Nettles
(74) *Attorney, Agent, or Firm* — CHIP LAW GROUP

(57) ABSTRACT

Provided is an imaging device that includes a pixel, a pixel circuit, a light-shielding wall, a through electrode, and a protrusion. The pixel includes a first photoelectric conversion unit and a second photoelectric conversion unit. The first photoelectric conversion unit is adjacent to the semiconductor substrate and performs photoelectric conversion of incident light. The second photoelectric conversion unit is in the semiconductor substrate and performs photoelectric conversion of the incident light transmitted through the first photoelectric conversion unit. The pixel circuit generates an image signal based on charges generated through photoelectric conversion of each of the first photoelectric conversion unit and the second photoelectric conversion unit. The light-shielding wall shields incident light. The through electrode is on the light-shielding wall, and transmits charges generated through photoelectric conversion in the first pho- (Continued)

toelectric conversion unit to the pixel circuit. The protrusion is an end of the light-shielding wall.

9 Claims, 16 Drawing Sheets

(56) References Cited

U.S. PATENT DOCUMENTS

| | | | | |
|---|---|---|---|---|
| 2019/0221597 | A1* | 7/2019 | Noh | H10F 39/8057 |
| 2019/0326345 | A1* | 10/2019 | Yamamoto | H10F 39/811 |
| 2019/0378865 | A1 | 12/2019 | Zhang | |
| 2022/0223636 | A1* | 7/2022 | Kim | H10F 39/8063 |

FOREIGN PATENT DOCUMENTS

| | | | |
|---|---|---|---|
| JP | 2018-098495 | A | 6/2018 |
| WO | 2016/143531 | A1 | 9/2016 |
| WO | 2017/110515 | A1 | 6/2017 |
| WO | 2017/169314 | A1 | 10/2017 |

* cited by examiner

IMAGING DEVICE AND IMAGING APPARATUS

CROSS REFERENCE TO RELATED APPLICATIONS

This application is a U.S. National Phase of International Patent Application No. PCT/JP2021/044636 filed on Dec. 6, 2021, which claims priority benefit of Japanese Patent Application No. JP 2020-208419 filed in the Japan Patent Office on Dec. 16, 2020. Each of the above-referenced applications is hereby incorporated herein by reference in its entirety.

FIELD

The present disclosure relates to an imaging device and an imaging apparatus.

BACKGROUND

There has been proposed an electronic device in which a photoelectric conversion device formed of an organic photoelectric conversion film is disposed on a back surface side of a semiconductor substrate on which an electronic circuit is formed (see Patent Literature 1, for example). This photoelectric conversion device is formed by sandwiching an organic photoelectric conversion film between transparent electrodes. The organic photoelectric conversion film absorbs incident light, for example, visible light to generate charges. The generated charges are transmitted to the electronic circuit of the semiconductor substrate via the transparent electrode and converted into an image signal. In the electronic device, a photoelectric conversion device (photodiode) is disposed also on the semiconductor substrate. Incident light, for example, infrared light transmitted through the photoelectric conversion device formed of an organic photoelectric conversion film is converted into an image signal by the photoelectric conversion device of the semiconductor substrate. The photoelectric conversion device formed of an organic photoelectric conversion film and the photoelectric conversion device of the semiconductor substrate are disposed for each pixel.

CITATION LIST

Patent Literature

Patent Literature 1: JP 2017-208496 A

SUMMARY

Technical Problem

However, in the above-described conventional technology, there is a problem that crosstalk occurs because of light obliquely entering from an adjacent pixel. Here, crosstalk is a phenomenon in which an image signal is affected by mixing of light different from incident light from a subject, such as light incident via another pixel. An interlayer insulating film is disposed between the above-described photoelectric conversion device formed of an organic photoelectric conversion film and the semiconductor substrate. When incident light transmitted through the organic photoelectric conversion film of an adjacent pixel obliquely crosses the interlayer insulating film and enters a photoelectric conversion unit of its own semiconductor substrate, crosstalk occurs. This crosstalk causes a problem of mixing of noise in an image signal.

The present disclosure proposes an imaging device and an imaging apparatus that reduce crosstalk in an imaging device in which a photoelectric conversion device formed of an organic photoelectric conversion film and a photoelectric conversion device formed on a semiconductor substrate are disposed for each pixel.

Solution to Problem

An imaging device according to the present disclosure includes: a pixel including a first photoelectric conversion unit that is disposed adjacent to a semiconductor substrate and performs photoelectric conversion of incident light and a second photoelectric conversion unit that is disposed on the semiconductor substrate and performs photoelectric conversion of the incident light transmitted through the first photoelectric conversion unit; a pixel circuit that is disposed on a surface of the semiconductor substrate different from a surface adjacent to the first photoelectric conversion unit and generates an image signal based on charges generated through photoelectric conversion of each of the first photoelectric conversion unit and the second photoelectric conversion unit; a light-shielding wall that is disposed at a boundary of the pixel in the semiconductor substrate and shields incident light; a through electrode that is disposed on the light-shielding wall, is formed into a shape penetrating the semiconductor substrate, and transmits charges generated through photoelectric conversion in the first photoelectric conversion unit to the pixel circuit; and a protrusion disposed at an end of the light-shielding wall.

DESCRIPTION OF EMBODIMENTS

Hereinafter, embodiments of the present disclosure will be described in detail with reference to the drawings. The description will be given in the following order. In each of the following embodiments, the same portions are denoted by the same reference signs, and repetitive description are omitted.

1. First Embodiment
2. Second Embodiment
3. Third Embodiment
4. Fourth Embodiment
5. Modification
6. Configuration of Imaging Apparatus

1. First Embodiment

Configuration of Imaging Device

Figure 1:
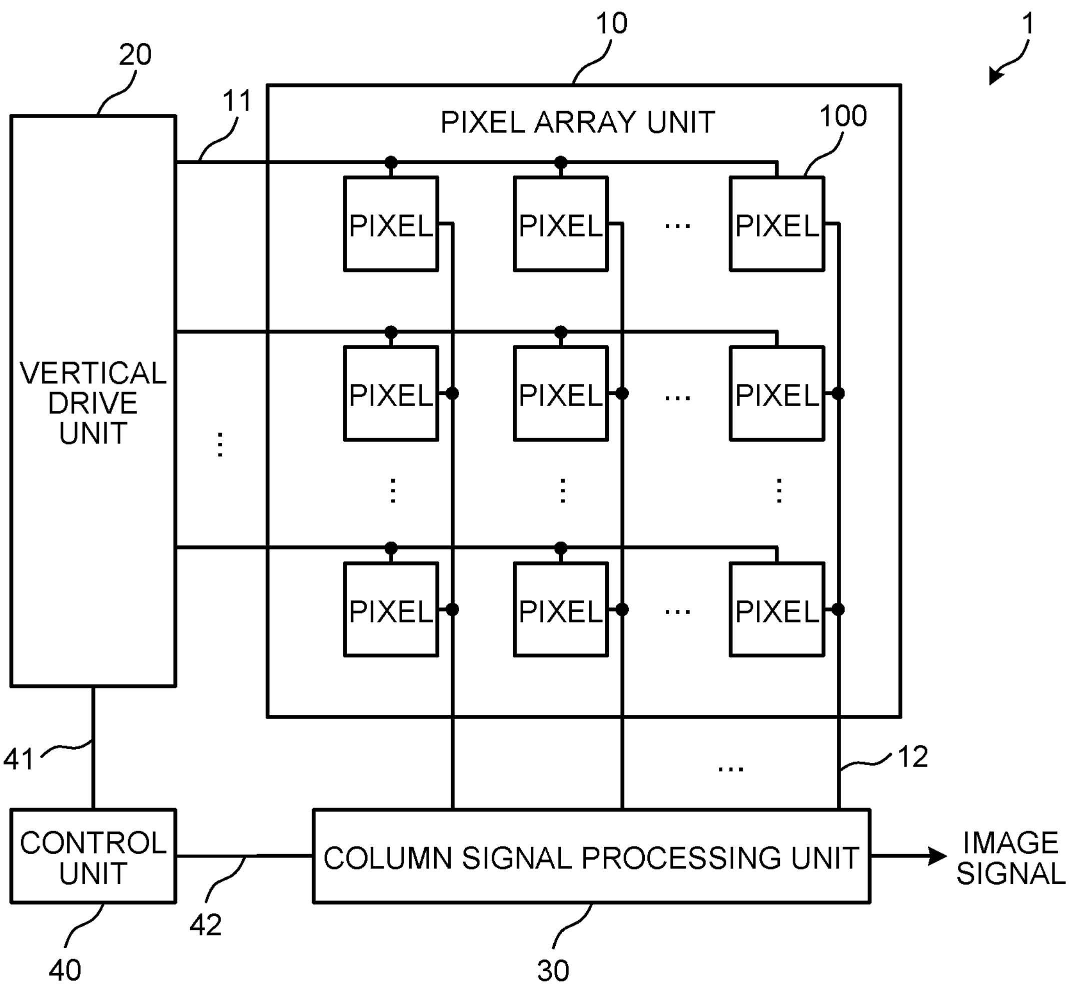
FIG. 1 is a diagram illustrating a configuration example of an imaging device according to an embodiment of the present disclosure.

FIG. 1 is a diagram illustrating a configuration example of an imaging device according to an embodiment of the present disclosure. The drawing is a block diagram illustrating a configuration example of an imaging device 1. The imaging device 1 is a semiconductor device that generates image data of a subject. The imaging device 1 includes a pixel array unit 10, a vertical drive unit 20, a column signal processing unit 30, and a control unit 40.

The pixel array unit 10 is configured by arranging a plurality of pixels 100. The pixel array unit 10 in the drawing is illustrated an example in which a plurality of pixels 100 are arranged in a shape of a two-dimensional matrix. Here, the pixel 100 includes a photoelectric conversion unit that performs photoelectric conversion of incident light, and it generates an image signal of a subject based on the emitted incident light. A photodiode may be used as the photoelectric conversion unit, for example. Signal lines 11 and 12 are wired to each pixel 100. The pixel 100 is controlled by a control signal transmitted by the signal line 11 to generate an image signal and outputs the generated image signal via the signal line 12. The signal line 11 is disposed for each row of the shape of the two-dimensional matrix and is shared the plurality of pixels 100 arranged in one row. The signal line 12 is disposed for each column of the shape of the two-dimensional matrix and is shared by the plurality of pixels 100 arranged in one column.

The vertical drive unit 20 generates a control signal of the pixel 100 described above. The vertical drive unit 20 in the drawing generates a control signal for each row of the two-dimensional matrix of the pixel array unit 10 and sequentially outputs the control signal via the signal line 11.

The column signal processing unit 30 processes the image signals generated by the pixels 100. The column signal processing unit 30 in the drawing simultaneously processes image signals from the plurality of pixels 100 arranged in one row of the pixel array unit 10 transmitted via the signal line 12. As this processing, for example, analog-digital conversion for converting an analog image signal generated by the pixel 100 into a digital image signal and correlated double sampling (CDS) for removing an offset error of the image signal may be performed. The processed image signal is output to a circuit or the like outside the imaging device 1.

The control unit 40 controls the vertical drive unit 20 and the column signal processing unit 30. The control unit 40 in the drawing outputs control signals via signal lines 41 and 42 to control the vertical drive unit 20 and the column signal processing unit 30, respectively. The imaging device 1 in FIG. 1 is an example of an imaging apparatus described in the claims. The pixel array unit 10 is an example of an imaging device described in the claims. The column signal processing unit 30 is an example of a processing circuit described in the claims.

Configuration of Pixel

Figure 2:
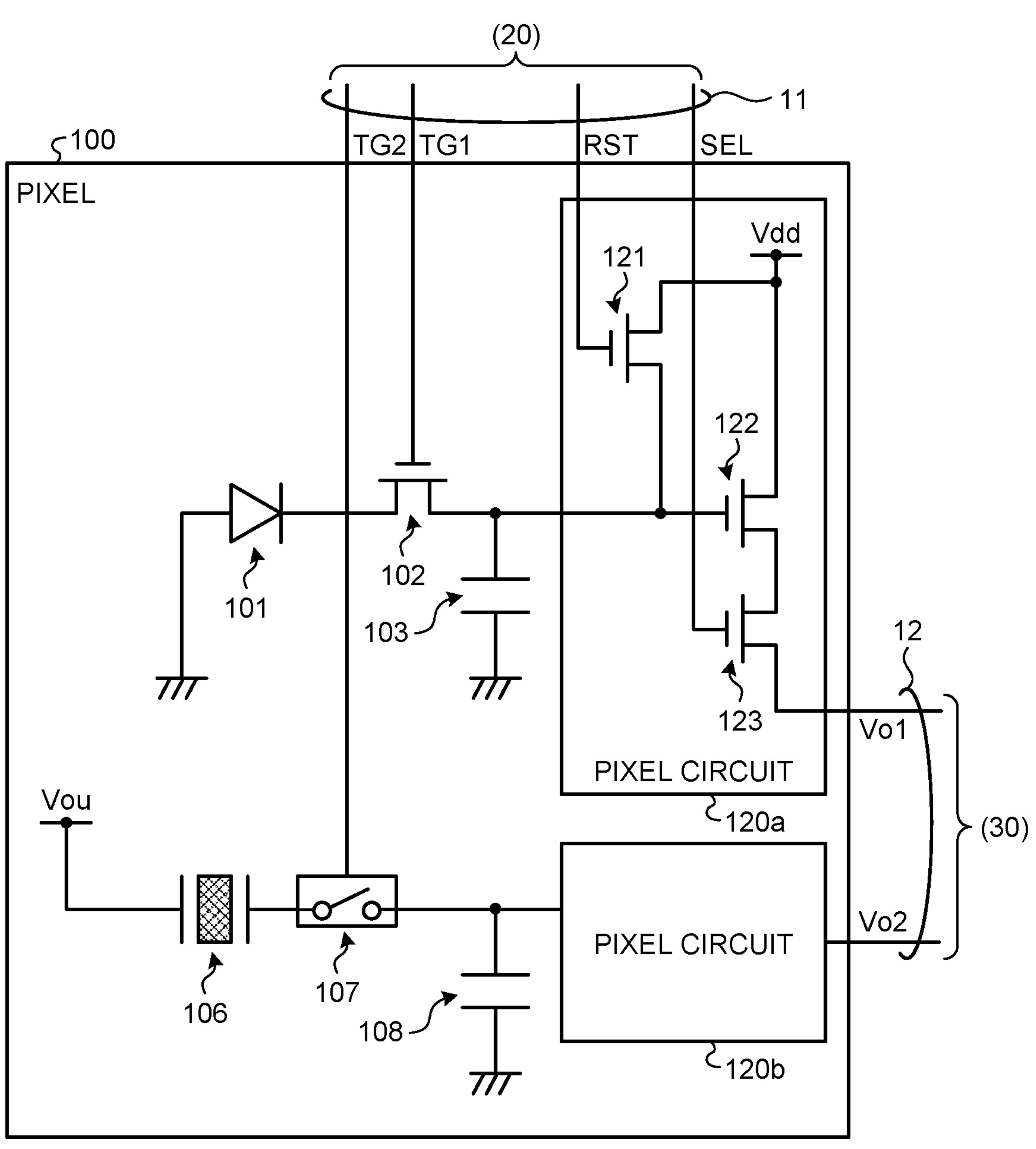
FIG. 2 is a diagram illustrating a configuration example of an imaging device according to a first embodiment of the present disclosure.

FIG. 2 is a diagram illustrating a configuration example of an imaging device according to a first embodiment of the present disclosure. The drawing is a circuit diagram illustrating a configuration example of the pixel 100. The pixel 100 in the drawing includes photoelectric conversion units 101 and 106, a charge transfer unit 102, a switching device 107, charge holding units 103 and 108, and pixel circuits 120*a* and 120*b*.

The pixel circuit 120*a* includes MOS transistors 121 to 123. The MOS transistors 121 to 123 and the charge transfer unit 102 may be formed of n-channel MOS transistors.

As described above, the signal lines 11 and 12 are wired to the pixel 100. The signal line 11 in the drawing includes a signal line TG1, a signal line TG2, a signal line RST, and a signal line SEL. The signal line 12 includes a signal line Vo1 and a signal line Vo2. In addition, power supply lines Vdd and Vou are wired to the pixel 100. The power supply line Vdd is a wiring that supplies power to the pixel 100. The power supply line Vou is a wiring that supplies a bias voltage of the photoelectric conversion unit 106.

The anode of the photoelectric conversion unit 101 is grounded, and the cathode is connected to the source of the charge transfer unit 102. The drain of the charge transfer unit 102 is connected to the source of the MOS transistor 121, the gate of the MOS transistor 122, and one end of the charge holding unit 103. The other end of the charge holding unit 103 is grounded. The drain of the MOS transistor 121 and the drain of the MOS transistor 122 are both connected to the power supply line Vdd. The source of the MOS transistor 122 is connected to the drain of the MOS transistor 123, and the source of the MOS transistor 123 is connected to the signal line Vo1. The signal line TG1, the signal line RST, and the signal line SEL are connected to gates of the charge transfer unit 102, the MOS transistor 121, and the MOS transistor 123, respectively.

One end of the photoelectric conversion unit 106 is connected to the power supply line Vou, and the other end is connected to the input terminal of the switching device 107. The output terminal of the switching device 107 is connected to one end of the charge holding unit 108 and a pixel circuit 120*b*. The other end of the charge holding unit 108 is grounded. The signal line TG2 is connected to the control signal terminal of the switching device 107. The configuration of the pixel circuit 120*b* is the same as the configuration of the pixel circuit 120*a*, and thus, description thereof is omitted.

The photoelectric conversion unit 101 performs photoelectric conversion of incident light. The photoelectric conversion unit 101 may be formed of a photodiode formed on a semiconductor substrate 130 described later. The photoelectric conversion unit 101 in the drawing can perform photoelectric conversion of infrared light of incident light.

The charge holding unit 103 and the charge holding unit 108 hold charges. The charge holding unit 103 and the charge holding unit 108 hold charges generated by the photoelectric conversion units 101 and 106, respectively. The charge holding units 103 and 108 may be formed of a floating diffusion (FD) which is a semiconductor region formed in the semiconductor substrate 130.

The charge transfer unit 102 transfers the charges generated through photoelectric conversion of the photoelectric conversion unit 101 to the charge holding unit 103. The charge transfer unit 102 transfers charges by forming electrically connecting the photoelectric conversion unit 101 and the charge holding unit 103. A control signal of the charge transfer unit 102 is transmitted by the signal line TG1.

A pixel circuit 120 generates an image signal based on the charges held in the charge holding units. The pixel circuits 120*a* and 120*b* generate image signals based on the charges held in the charge holding units 103 and 108, respectively, and output the image signals to the signal lines Vo1 and Vo2, respectively. As described above with the pixel circuit 120*a* as an example, the pixel circuit 120*a* includes the MOS transistors 121 to 123. The MOS transistor 121 resets the charge holding unit 103. This reset may be performed by discharging the charges in the charge holding unit 103 by electrically connecting the charge holding unit 103 and the power supply line Vdd. A control signal of the MOS transistor 121 is transmitted by the signal line RST. The gate of the MOS transistor 122 is connected to the charge holding unit 103. Thus, an image signal having a voltage corresponding to the charges held in the charge holding unit 103 is generated at the source of the MOS transistor 122. Further, making the MOS transistor 123 conductive enables this image signal to be output to the signal line Vo1. A control signal of the MOS transistor 123 is transmitted by the signal line SEL.

The photoelectric conversion unit 106 performs photoelectric conversion of incident light. As described later, the photoelectric conversion unit 106 is a photoelectric conversion device configured by sandwiching a photoelectric conversion film between transparent electrodes and the like. The photoelectric conversion unit 106 is configured as a two-terminal device and generates charges based on photoelectric conversion. The photoelectric conversion unit 106 in the drawing can perform photoelectric conversion of visible light of incident light.

The switching device 107 is a device that transfers the charges generated by the photoelectric conversion unit 106 similar to the charge transfer unit 102. The switching device 107 is configured as a three-terminal device and includes an input terminal, an output terminal, and a control signal terminal. The switching device 107 becomes conductive when a control signal is input to the control signal terminal and transmits the charges generated by the photoelectric conversion unit 106 to the charge holding unit 108.

As described later, the photoelectric conversion unit 106 and the switching device 107 are integrally configured in the pixel 100. In the drawing, the photoelectric conversion unit 106 and the switching device 107 are illustrated as different devices for convenience.

Configuration of Plane of Pixel

Figure 3:
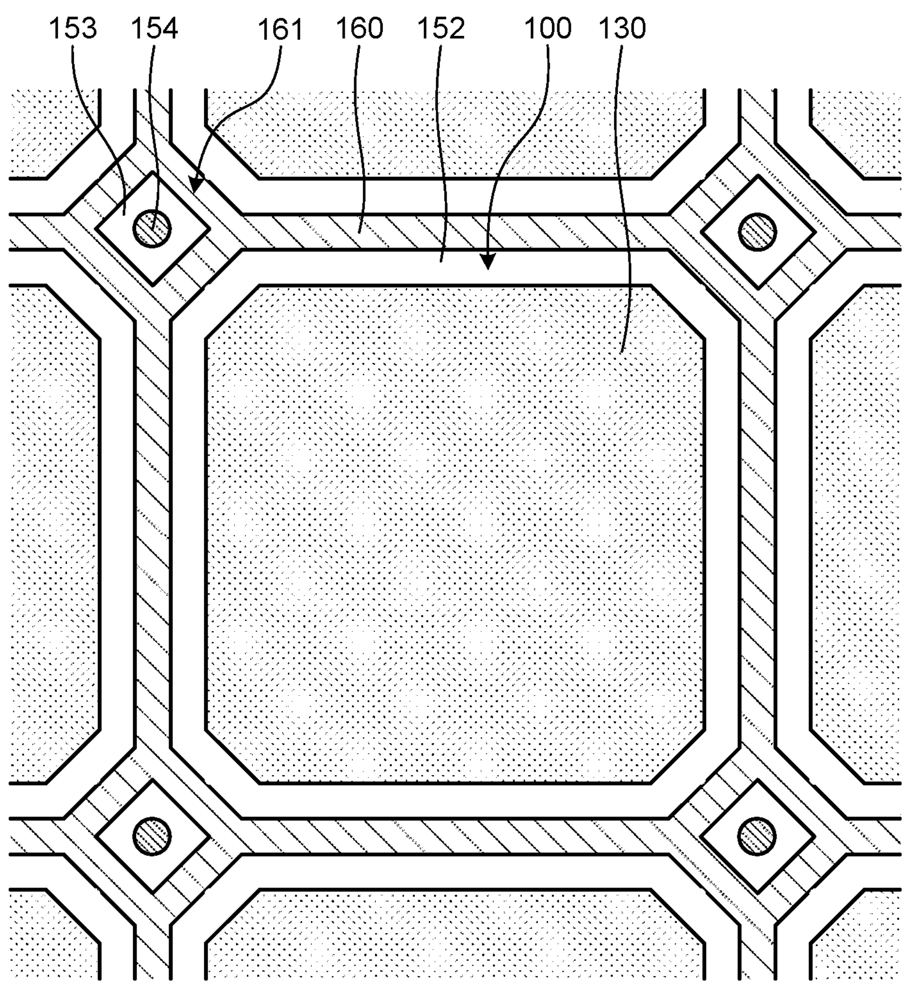
FIG. 3 is a plan view illustrating a configuration example of a pixel according to the first embodiment of the present disclosure.

FIG. 3 is a plan view illustrating a configuration example of a pixel according to the first embodiment of the present disclosure. The drawing is a plan view illustrating a configuration of the pixel 100, illustrating a configuration of a plane of the part of a semiconductor substrate 130 described later. The semiconductor substrate 130 having a substantially rectangular shape is disposed at the center of the pixel 100. As described later, the photoelectric conversion unit 101 is formed on the semiconductor substrate 130. A light-shielding wall 160 is disposed at the boundary of the pixel 100. As illustrated in the drawing, the light-shielding wall 160 is formed into a shape surrounding the periphery of the semiconductor substrate 130. An insulating film 152 is disposed between the semiconductor substrate 130 and the light-shielding wall 160. A through electrode 154 is disposed at a corner of the boundary of the pixel 100. The through electrode 154 is an electrode formed into a shape penetrating the semiconductor substrate 130. The through electrode 154 is disposed in a through hole 161 formed in the light-shielding wall 160. An insulating film 153 is disposed between the through electrode 154 and the light-shielding wall 160.

The shape of the through hole 161 is not limited to this example. For example, the through hole 161 formed as a circular opening may also be used. The through hole 161 and the through electrode 154 may also be disposed in a region other than a corner of the pixel 100.

Section Configuration of Pixel

Figure 4:
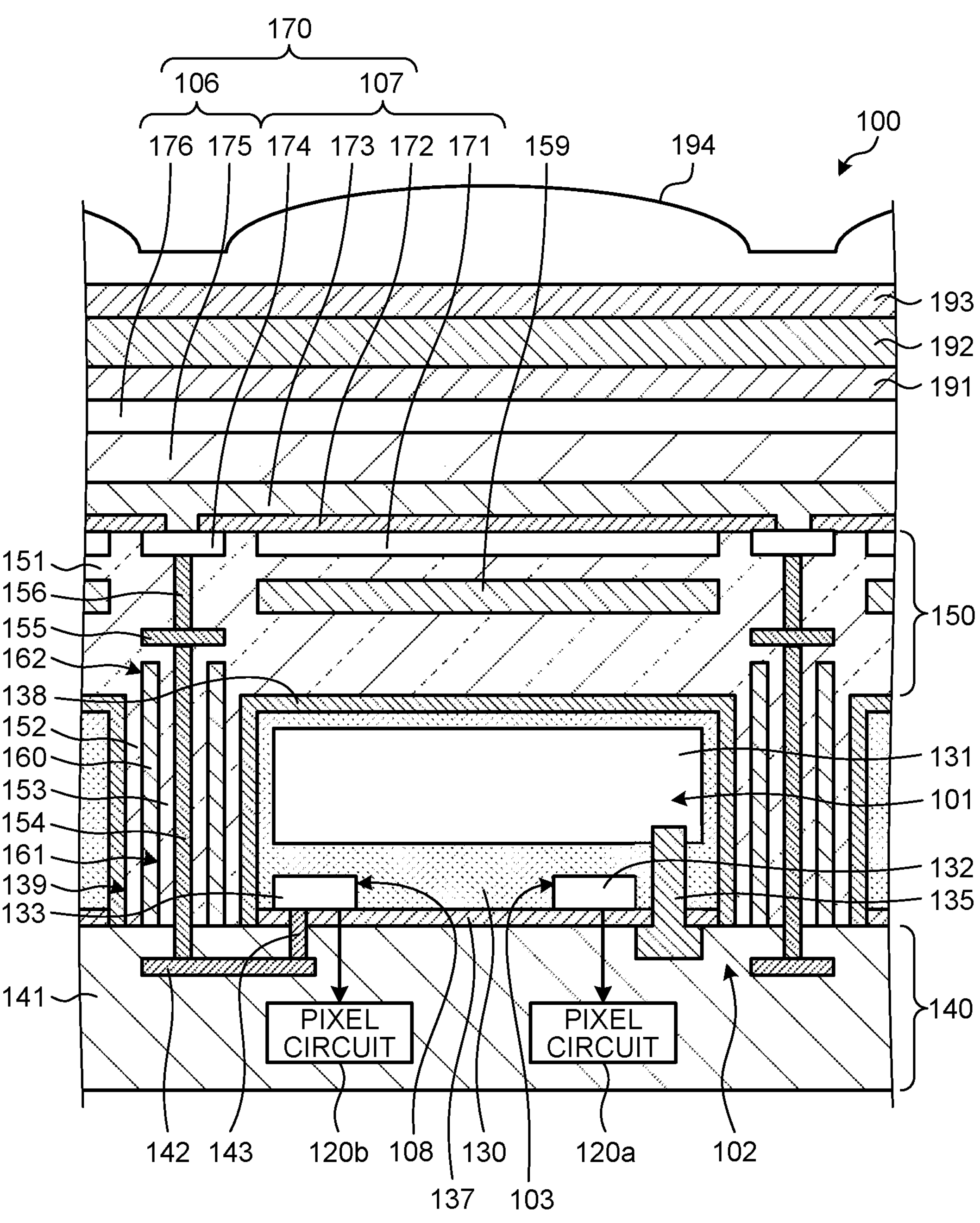
FIG. 4 is a sectional view illustrating a configuration example of the pixel according to the first embodiment of the present disclosure.

FIG. 4 is a sectional view illustrating a configuration example of the pixel according to the first embodiment of the present disclosure. The drawing is a sectional view illustrating a configuration example of the pixel 100. The pixel 100 in the drawing includes the semiconductor substrate 130, the light-shielding wall 160, the through electrode 154, a wiring region 140, an intermediate layer 150, a photoelectric conversion device 170, a sealing film 191, a color filter 192, a planarization film 193, and an on-chip lens 194.

The semiconductor substrate 130 is a semiconductor substrate on which devices such as the photoelectric conversion unit 101 are disposed. In the semiconductor substrate 130 in the drawing, the photoelectric conversion unit 101, the charge transfer unit 102, and the charge holding units 103 and 108 are illustrated. The semiconductor substrate 130 may be made of silicon (Si), for example. The photoelectric conversion unit 101 and the like are disposed in a well region formed in the semiconductor substrate 130. For convenience, the semiconductor substrate 130 in the drawing is assumed to constitute a p-type well region. A device may be formed by disposing an n-type or p-type semiconductor region in the p-type well region.

The rectangle described in the semiconductor substrate 130 in the drawing represents an n-type semiconductor region. The photoelectric conversion unit 101 includes an n-type semiconductor region 131. Specifically, a photodiode formed of a pn junction formed at an interface between the n-type semiconductor region 131 and a surrounding p-type well region corresponds to the photoelectric conversion unit 101. The photoelectric conversion unit 101 performs photoelectric conversion of incident light transmitted through the photoelectric conversion device 170 disposed adjacent to the semiconductor substrate 130. The photoelectric conversion unit 101 is an example of a second photoelectric conversion unit described in the claims.

The charge holding units 103 and 108 are formed of n-type semiconductor regions 132 and 133, respectively. These n-type semiconductor regions 132 and 133 constitute the above-described FD.

The charge transfer unit 102 includes semiconductor regions 131 and 132 and a gate electrode 135. The n-type semiconductor regions 131 and 132 correspond to the source region and the drain region of the charge transfer unit 102. The gate electrode 135 is disposed on the front surface side of the semiconductor substrate 130 and includes a columnar part having a depth reaching the n-type semiconductor region 131. A gate insulating film (not illustrated) is disposed between the gate electrode 135 and the semiconductor substrate 130. When a drive voltage is applied to the gate electrode 135, a channel is formed in the well region adjacent to the gate electrode 135, and the n-type semiconductor regions 131 and 132 are brought into a conductive state. That is, the photoelectric conversion unit 101 and the charge holding unit 103 are electrically connected, and the charges of the photoelectric conversion unit 101 are transferred to the charge holding unit 103. In this manner, the charge transfer unit 102 is formed of a vertical transistor that transfers charges in a thickness direction of the semiconductor substrate 130.

The charge holding unit 108 holds the charges generated by the photoelectric conversion device 170. The charge holding unit 108 holds charges transmitted via an electrode 156, a light-shielding film 155, the through electrode 154, a wiring 142, and a contact plug 143 described later.

Image signals are generated by the pixel circuits **120*a* and 120*b* based on the charges held in the charge holding units 103 and 108, respectively. The pixel circuits 120*a* and 120*b* are disposed on the semiconductor substrate 130. The charge transfer unit 102, the charge holding units 103 and 108, and the pixel circuits 120*a* and 120*b*** are examples of a pixel circuit described in the claims.

A fixed charge film 138 is disposed around the semiconductor substrate 130. The fixed charge film 138 is a film that forms fixed charges. An electric field based on the fixed charge generates a charge accumulation layer (for example, a hole accumulation layer) in the vicinity of the front surface of the semiconductor substrate 130. This charge accumulation layer can reduce generation of charges due to the interface state of the semiconductor substrate 130. It is possible to reduce the dark current caused by the charges of the interface state. The fixed charge film 138 may be made of aluminum oxide ($Al_2O_3$) or hafnium oxide ($HfO_2$), for example.

An insulating film 137 is disposed on the front surface side of the semiconductor substrate 130. The insulating film 137 is a film that insulates the front surface side of the semiconductor substrate 130. The insulating film 137 may be made of $SiO_2$ or silicon nitride (SiN).

The light-shielding wall 160 is disposed at the boundary of the pixel 100 in the semiconductor substrate 130 to shield incident light. As described above, the light-shielding wall 160 is formed in a wall shape surrounding the region of the semiconductor substrate 130 for each pixel 100. The light-shielding wall 160 shields incident light leaking from an adjacent pixel 100. The light-shielding wall 160 is disposed in an opening 139 having a groove shape formed in the semiconductor substrate 130. The light-shielding wall 160 may be made of metal, such as tungsten (W) or aluminum (Al), for example.

A protrusion 162 is disposed on the light-shielding wall 160 in the drawing. The protrusion 162 is a protruding region formed at an end of the light-shielding wall 160 on the side adjacent to the photoelectric conversion device 170. The protrusion 162 is formed into a shape protruding in a direction from the surface on the back side of the semiconductor substrate 130 to the photoelectric conversion device 170. That is, the protrusion 162 is formed into a shape protruding to the back surface side of the semiconductor substrate 130 which is the side irradiated with incident light. Disposing the protrusion 162 can improve the light shielding ability of the light-shielding wall 160. The protrusion 162 may be made of the same material as the light-shielding wall 160. The protrusion 162 may be formed at all the ends of the light-shielding wall 160. In this case, the protrusion 162 is formed into a shape surrounding the pixel 100. The protrusion 162 may also be disposed at some of the ends of the light-shielding wall 160, for example, at an end in the vicinity of the through electrode 154.

The through electrode 154 is an electrode having a shape penetrating the semiconductor substrate 130. The through electrode 154 connects a device disposed on the back surface side of the semiconductor substrate 130 and a device disposed on the front surface side. The through electrode 154 in the drawing transmits a signal of the photoelectric conversion device 170 to the charge holding unit 108 disposed on the semiconductor substrate 130. As described above, the through electrode 154 in the drawing is disposed in the through hole 161 formed in the light-shielding wall 160. The through electrode 154 in the drawing is connected to the photoelectric conversion device 170 via the light-shielding film 155 and the electrode 156. The through electrode 154 may be made of W, for example.

The insulating film 152 is disposed between the light-shielding wall 160 and the semiconductor substrate 130. The insulating film 153 is disposed between the through electrode 154 and the light-shielding wall 160. These insulating films 152 and 153 may be made of the same material as an insulating layer 151, which is described later. The insulating film 152 is an example of a first insulating film described in the claims. The insulating film 153 is an example of a second insulating film described in the claims.

The wiring region 140 is a region disposed on the front surface side of the semiconductor substrate 130. Wiring and the like of devices are disposed in the wiring region 140. The wiring region 140 includes an insulating layer 141 and a wiring 142. The insulating layer 141 insulates the wiring 142 and the like. The insulating layer 141 may be made of $SiO_2$, for example. The wiring 142 is a conductor that transmits a signal or the like of the devices. The wiring 142 may be made of metal, such as W or copper (Cu). The wiring 142 and a semiconductor region 133 may be connected by the contact plug 143. The contact plug 143 is made of columnar metal. The through electrode 154 is connected to the wiring 142 in the drawing.

The intermediate layer 150 is a region disposed between the semiconductor substrate 130 and the photoelectric conversion device 170. In the intermediate layer 150 in the drawing, an insulating layer 151, a color filter 159, a light-shielding film 155, and an electrode 156 are disposed.

The insulating layer 151 insulates the semiconductor substrate 130 and the photoelectric conversion device 170 from each other. The insulating layer 151 may be made of $SiO_2$, for example.

The color filter 159 is an optical filter that transmits light having a predetermined wavelength of incident light. The color filter 159 in the drawing is a color filter disposed between a photoelectric conversion device 170 described later and the semiconductor substrate 130. A color filter that transmits infrared light may be applied to the color filter 159.

The light-shielding film 155 is disposed in vicinity to the through hole 161 of the light-shielding wall 160 to shield incident light. The light-shielding film 155 may be made of the same material as the through electrode 154. Disposing the light-shielding film 155 between the through electrode 154 and the electrode 156 described later can reduce occurrence of connection failure between the through electrode 154 and the electrode 156 even when the electrode 156 is formed at a position shifted from the through electrode 154 in the manufacturing process of the imaging device 1.

The electrode 156 is a columnar electrode disposed between the light-shielding film 155 and the photoelectric conversion device 170. The electrode 156 may be made of W, for example.

The photoelectric conversion device 170 is a device that is disposed adjacent to the semiconductor substrate 130 and performs photoelectric conversion of incident light. The photoelectric conversion device 170 in the drawing is adjacent to the semiconductor substrate 130 with the intermediate layer 150 interposed between them. The photoelectric conversion device 170 includes a first electrode 174, an insulating film 172, a transparent semiconductor layer 173, a photoelectric conversion film 175, a second electrode 176, and a control electrode 171.

The photoelectric conversion film 175 is formed of an organic photoelectric conversion film, and it generates charges according to incident light. The photoelectric conversion film 175 may be made of an organic photoelectric conversion material containing a rhodamine dye, a merocyanine dye, quinacridone, a phthalocyanine dye, a coumarin dye, tris-8-hydroxyquinoline Al, or the like, for example. The second electrode 176 is a transparent electrode disposed adjacent to the photoelectric conversion film 175. The second electrode 176 may be made of indium-tin oxide (ITO), for example. The transparent semiconductor layer 173 accumulates the charges generated by the photoelectric conversion film 175. The transparent semiconductor layer 173 may be made of, for example, an oxide semiconductor film, such as indium-gallium-zinc oxide (IGZO). The insulating film 172 is a film that insulates the photoelectric conversion film 175 and the transparent semiconductor layer 173 from each other. The insulating film 172 may be made of $SiO_2$, for example. The control electrode 171 controls accumulation of charges in the transparent semiconductor layer 173. The control electrode 171 may be made of ITO, for example. The first electrode 174 is an electrode that reads out the charges accumulated in the transparent semiconductor layer 173.

The second electrode 176 and the photoelectric conversion film 175 correspond to the photoelectric conversion unit 106 described in FIG. 2. The transparent semiconductor layer 173, the insulating film 172, the control electrode 171, and the first electrode 174 correspond to the switching device 107 in FIG. 2. The second electrode 176 is connected to the above-described power supply line Vou. The first electrode 174 is connected to the charge holding unit 108 via the through electrode 154. The control electrode 171 is connected to the vertical drive unit 20 described in FIG. 1 via a wiring (not illustrated).

As described above, the second electrode 176 is connected to the power supply line Vou. Application of a control signal having a voltage higher than the bias voltage of the power supply line Vou to the control electrode 171 during an exposure period causes, for example, electrons among the charges generated by the photoelectric conversion film 175 to move to the transparent semiconductor layer 173 and accumulate. Application of a control signal having a voltage lower than the bias voltage of the power supply line Vou to the control electrode 171 after the lapse of the exposure period causes the charges accumulated in the transparent semiconductor layer 173 to move to the first electrode 174 and transmit to the charge holding unit 108 via the through electrode 154. The photoelectric conversion device 170 is an example of a first photoelectric conversion unit described in the claims.

The sealing film 191 seals the photoelectric conversion device 170. The color filter 192 is an optical filter that transmits light of a predetermined wavelength of incident light similarly to the color filter 159. The color filter 192 in the drawing transmits infrared light and one of red light, green light, and blue light. The planarization film 193 planarizes the surface of the color filter 192. The on-chip lens 194 is a lens that collects incident light on the photoelectric conversion device 170 and the photoelectric conversion unit 101.

As illustrated in the drawing, the stacked photoelectric conversion device 170 and photoelectric conversion unit 101 are disposed in the pixel 100. As described above, the photoelectric conversion device 170 performs photoelectric conversion of visible light. In the color filter 192, a color filter that transmits any of red light, green light, and blue light in addition to infrared light is disposed. In this case, the color filter 192 corresponding to any of infrared light+red light, infrared light+green light, and infrared light+blue light is disposed in the pixel 100. The photoelectric conversion device 170 performs photoelectric conversion of visible light transmitted through each color filter 192 disposed in the pixel 100. As described above, the color filter 159 transmits infrared light. The color filter 159 attenuates visible light. The photoelectric conversion unit 101 performs photoelectric conversion of infrared light transmitted through the photoelectric conversion device 170 and the color filters 192 and 159.

In this manner, the pixel 100 performs photoelectric conversion of visible light and infrared light, and it generates an image signal of visible light and an image signal of infrared light. The imaging device 1 can generate images of a subject in visible light and infrared light.

Configuration of Light-Shielding Wall

Figure 5:
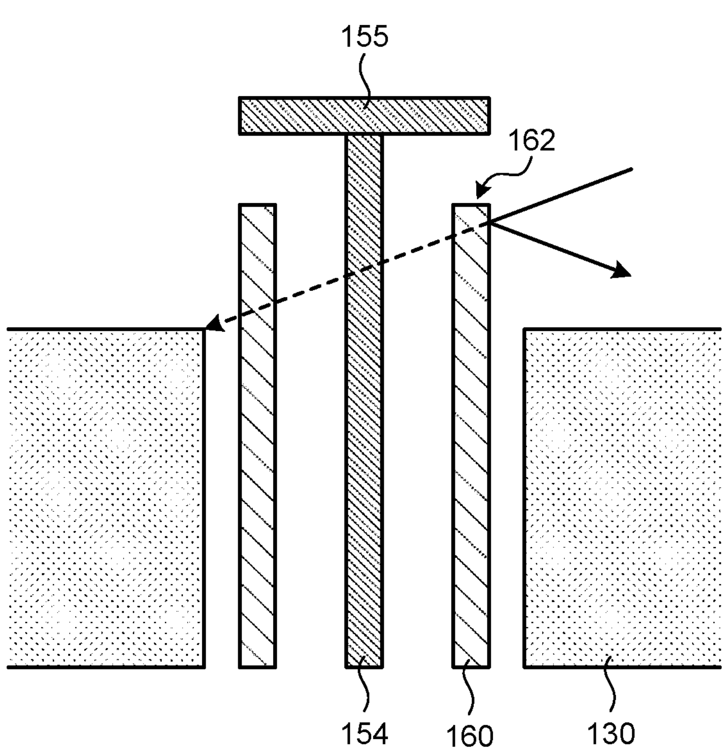
FIG. 5 is a diagram illustrating a configuration example of a light-shielding wall according to the first embodiment of the present disclosure.

FIG. 5 is a diagram illustrating a configuration example of a light-shielding wall according to the first embodiment of the present disclosure. The drawing is a diagram illustrating a configuration of the part of the light-shielding wall 160 and the through electrode 154 in the pixel 100. As described above, the protrusion 162 is disposed on the back surface side of the light-shielding wall 160. Disposing the protrusion 162 can shield incident light obliquely entering the vicinity of the boundary on the back surface side of the semiconductor substrate 130. The solid arrow in the drawing indicates an example in which oblique incident light is reflected by the protrusion 162 and shield. The protrusion length of the protrusion 162 from the back surface side of the semiconductor substrate 130 is preferably 5 μm or less. This is because an increase in the film thickness of the imaging device 1 can be reduced while shielding incident light.

Without the protrusion 162, oblique incident light enters the photoelectric conversion unit 101 of an adjacent pixel to cause crosstalk. The dotted arrow in the drawing indicates this state. With a different type of color filter 192 disposed in an adjacent pixel 100, incident light having a wavelength different from the wavelength corresponding to the color filter 192 of its own pixel 100 irradiates the photoelectric conversion unit 101. A phenomenon like this in which an image signal is affected by mixing of incident light of a color different from a wavelength (color) corresponding to the pixel 100 is referred to as color mixture. The color mixture is an example of crosstalk.

The light-shielding wall 160 and the protrusion 162 in the drawing are illustrated as an example in which they are formed of a member that shields incident light by reflecting incident light. The light-shielding wall 160 and the protrusion 162 may be formed of a member that shields incident light by absorbing incident light.

[Method for Manufacturing Imaging Device]

Figure 6A:
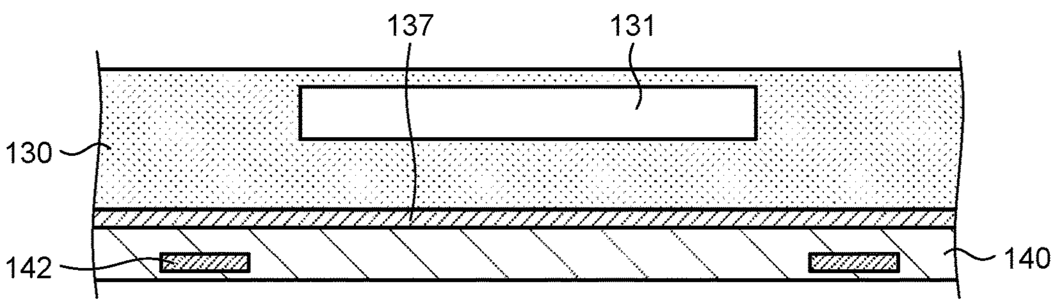
FIG. 6A is a diagram illustrating an example of a method for manufacturing the imaging device according to the first embodiment of the present disclosure.

FIGS. 6A, 6B, 6C, 6D, 6E, 6F, 6G, 6H, 6I, and 6J are diagrams illustrating an example of a method for manufacturing an imaging device according to the first embodiment of the present disclosure. FIGS. 6A, 6B, 6C, 6D, 6E, 6F, 6G, 6H, 6I, and 6J are diagrams illustrating an example of the manufacturing process of the imaging device 1. First, form a well region, the semiconductor region 131, and the like on the semiconductor substrate 130. Next, dispose the insulating film 137 and the wiring region 140 on the front surface side of the semiconductor substrate 130 (FIG. 6A).

Figure 6B:
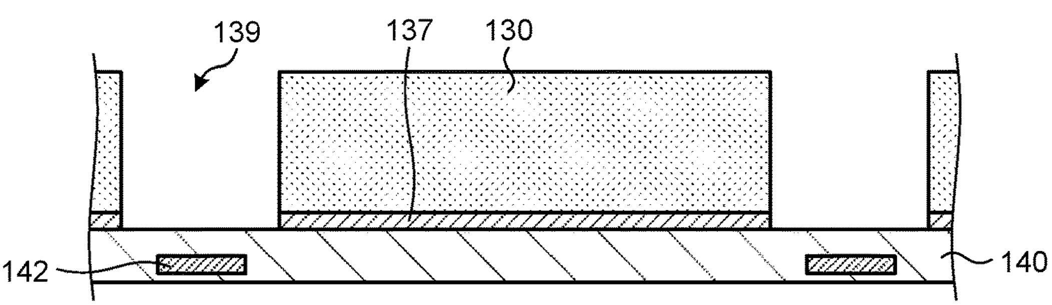
FIG. 6B is a diagram illustrating an example of the method for manufacturing the imaging device according to the first embodiment of the present disclosure.

Next, form the opening 139 from the back surface side of the semiconductor substrate 130 (FIG. 6B). This may be performed by dry etching, for example.

Figure 6C:
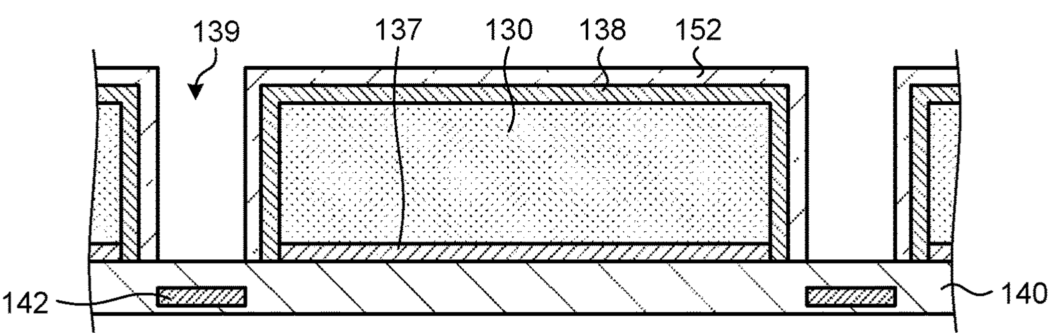
FIG. 6C is a diagram illustrating an example of the method for manufacturing the imaging device according to the first embodiment of the present disclosure.

Next, sequentially dispose the fixed charge film 138 and the insulating film 152 on the back surface side of the semiconductor substrate 130 including the opening 139 (FIG. 6C). The fixed charge film 138 may be disposed by forming a film of $Al_2O_3$ using chemical vapor deposition (CVD) or the like. The insulating film 152 may be disposed by forming a $SiO_2$ film using CVD or the like. The length of the protrusion 162 may be adjusted by adjusting the thickness of the insulating film 152.

Figure 6D:
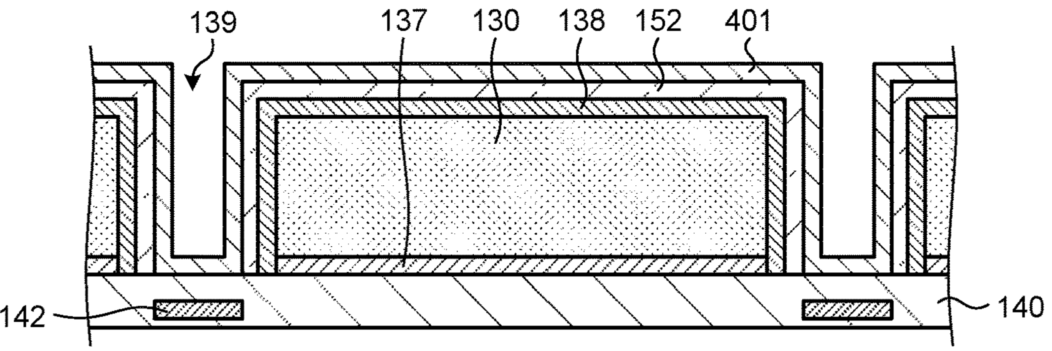
FIG. 6D is a diagram illustrating an example of the method for manufacturing the imaging device according to the first embodiment of the present disclosure.

Next, dispose a material film 401 of the light-shielding wall 160 on the back surface side of the semiconductor substrate 130 including the opening 139 (FIG. 6D). This may be performed by forming a film of W or the like using CVD or the like.

Figure 6E:
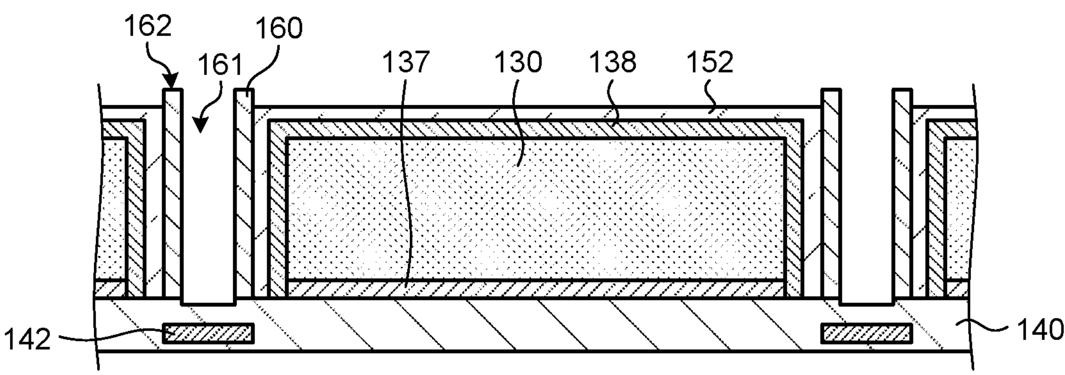
FIG. 6E is a diagram illustrating an example of the method for manufacturing the imaging device according to the first embodiment of the present disclosure.

Next, remove the material film 401 on the back surface side of the semiconductor substrate 130 and the bottom of the opening 139 (FIG. 6E). This may be performed by etching (etching back) the material film 401. Etching back of the material film 401 may be performed by dry etching, for example. Through this step, the light-shielding wall 160 and the protrusion 162 may be formed in the opening 139. The opening inside the formed light-shielding wall 160 constitutes the through hole 161.

Figure 6F:
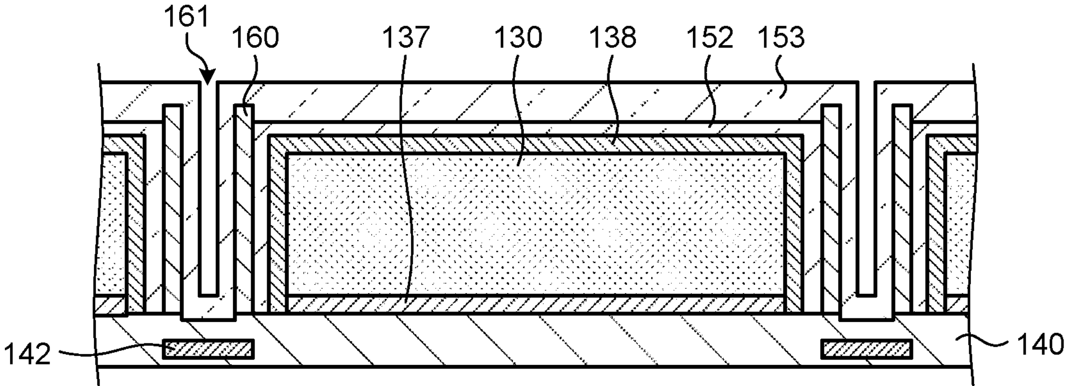
FIG. 6F is a diagram illustrating an example of the method for manufacturing the imaging device according to the first embodiment of the present disclosure.

Next, dispose the insulating film 153 on the back surface side of the semiconductor substrate 130 including the through hole 161 (FIG. 6F). This may be performed by the same step as the step for the insulating film 152 in FIG. 6C.

Figure 6G:
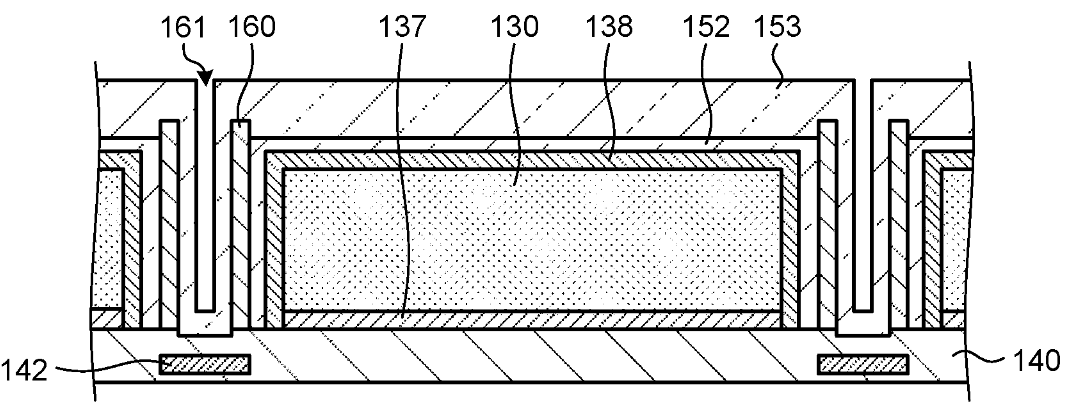
FIG. 6G is a diagram illustrating an example of the method for manufacturing the imaging device according to the first embodiment of the present disclosure.

Next, stack a material film of the insulating film 153 on the back surface side of the semiconductor substrate 130 to thicken the insulating film 153 (FIG. 6G). This is to prevent exposure of the back surface side of the semiconductor substrate 130 due to grinding of the insulating film 153 by etching in the next step.

Figure 6H:
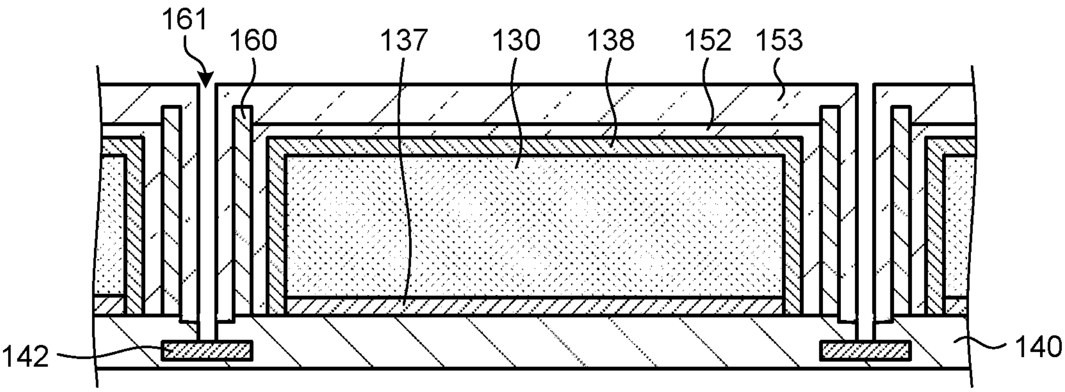
FIG. 6H is a diagram illustrating an example of the method for manufacturing the imaging device according to the first embodiment of the present disclosure.

Next, perform etching on the through hole 161 until the bottom reaches the wiring 142 (FIG. 6H). This may be performed by etching (etching back) the insulating film 153 and the insulating layer 141 of the wiring region 140.

Figure 6I:
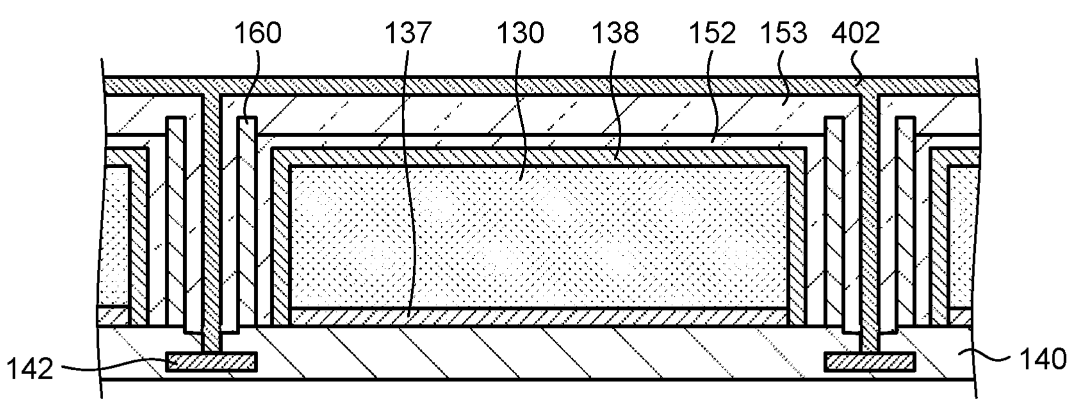
FIG. 6I is a diagram illustrating an example of the method for manufacturing the imaging device according to the first embodiment of the present disclosure.

Next, dispose a material film 402 of the through electrode 154 on the back surface side of the semiconductor substrate 130 including the through hole 161 (FIG. 6I). This may be performed in the same manner as in disposing the material film 401 in FIG. 6D.

Figure 6J:
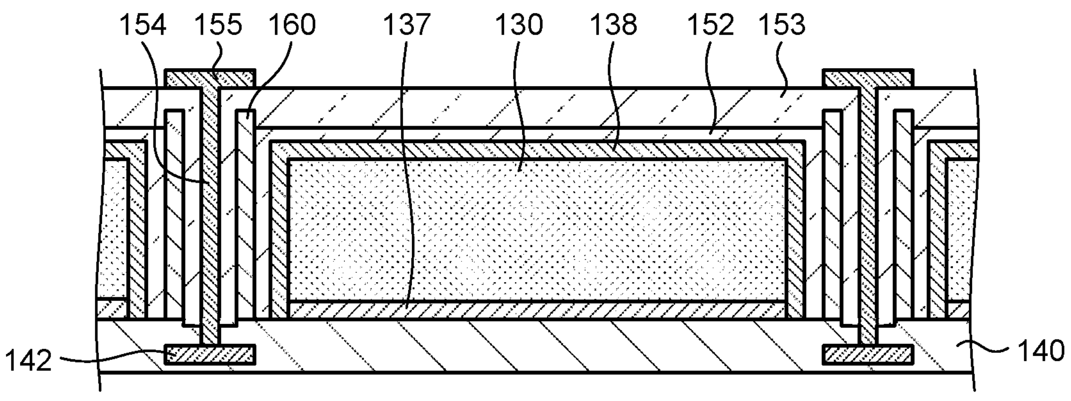
FIG. 6J is a diagram illustrating an example of the method for manufacturing the imaging device according to the first embodiment of the present disclosure.

Next, perform etching on the material film 402 to form the through electrode 154 and the light-shielding film 155 (FIG. 6J). This etching may be performed by dry etching, for example.

The light-shielding wall 160 including the protrusion 162 and the through electrode 154 may be formed through these steps.

Next, dispose the insulating layer 151 to cover the light-shielding film 155. Next, form the color filter 159. Next, dispose the insulating layer 151 to cover the color filter 159. Next, form a through hole having a depth reaching the light-shielding film 155 in the insulating layer 151 in the vicinity of the through electrode 154 and embed the electrode 156. The intermediate layer 150 may be thus formed.

Thereafter, form the photoelectric conversion device 170, the sealing film 191, the color filter 192, the planarization film 193, and the on-chip lens 194, whereby the imaging device 1 may be manufactured.

In this manner, in the imaging device 1 according to the first embodiment of the present disclosure, the protrusion 162 formed on the light-shielding wall 160 at the boundary of the pixel 100 can shield incident light obliquely entering the pixel 100. Crosstalk can be reduced, and mixing of noise into an image signal can be reduced.

2. Second Embodiment

In the pixel 100 of the above-described first embodiment, the protrusion 162 is disposed on the light-shielding wall 160. The pixel 100 according to a second embodiment of the present disclosure is different from that of the above-described first embodiment in including a protrusion having a shape surrounding the color filter 159.

Section Configuration of Pixel

Figure 7:
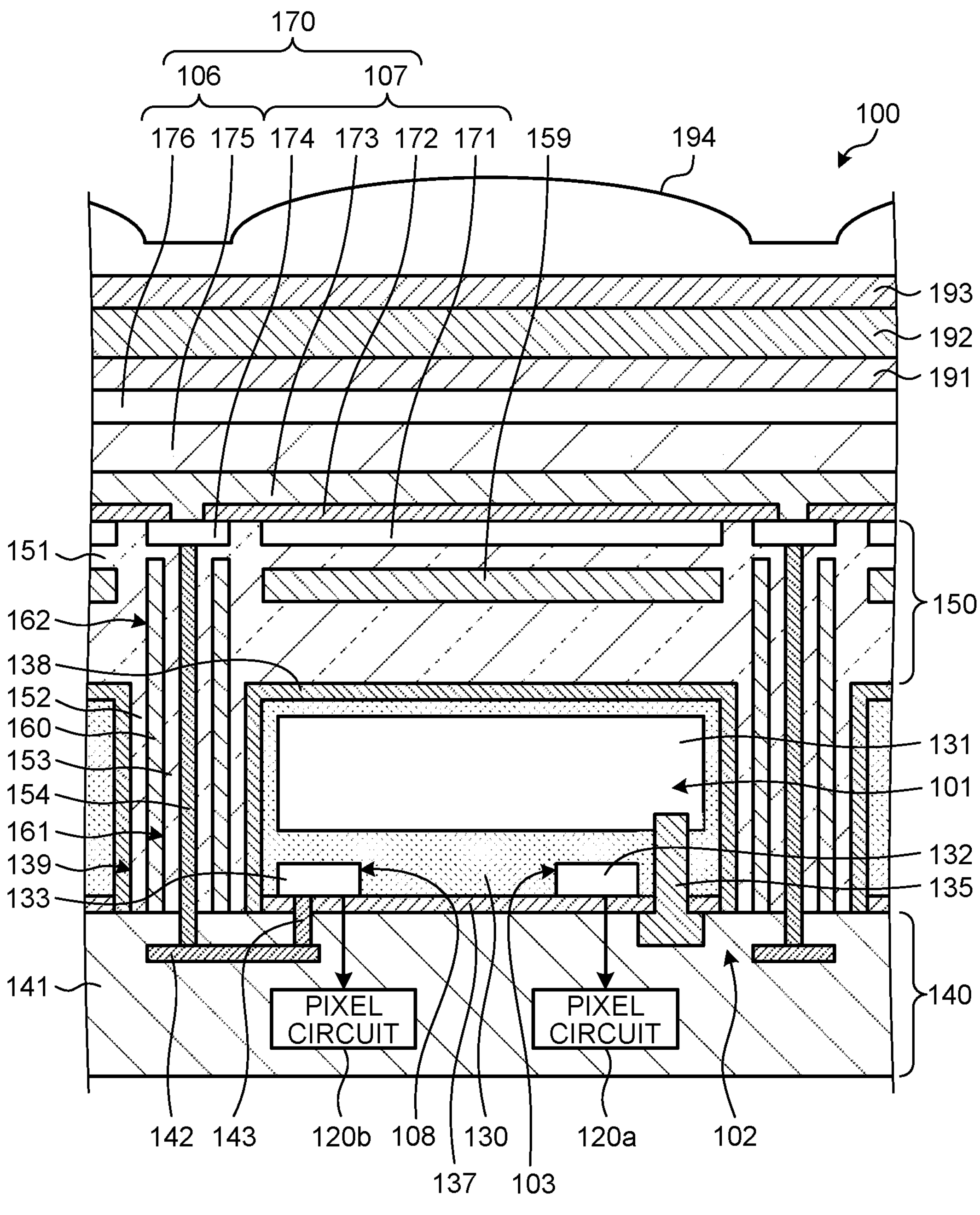
FIG. 7 is a sectional view illustrating a configuration example of a pixel according to a second embodiment of the present disclosure.

FIG. 7 is a sectional view illustrating a configuration example of a pixel according to the second embodiment of the present disclosure. This drawing is a sectional view illustrating a configuration example of the pixel 100 similarly to FIG. 4. The pixel 100 in the drawing is different from the pixel 100 in FIG. 4 in that the light-shielding film 155 and the electrode 156 are omitted, and the protrusion 162 is formed into a shape surrounding the color filter 159.

The protrusion 162 in the drawing has a protruding length reaching the region where the color filter 159 is disposed from the back surface side of the semiconductor substrate 130, and it is formed into a shape surrounding the color filter 159. This can further improve the light shielding ability of the protrusion 162.

The light-shielding wall 160 including such a protrusion 162 may be formed by the following process, for example. First, form an opening having a depth reaching the wiring region 140 in the insulating layer 151 of the intermediate layer 150 and the insulating layer 151 after the color filter 159 is disposed. Next, embed a material film of the light-shielding wall 160 in the opening to form the light-shielding wall 160.

The configuration of the imaging device 1 other than this is the same as the configuration of the imaging device 1 in the first embodiment of the present disclosure, and thus description thereof is omitted.

In this manner, in the imaging device 1 according to the second embodiment of the present disclosure, the protrusion 162 having a shape surrounding the color filter 159 is disposed on the light-shielding wall 160 of the pixel 100. This can improve the light shielding ability of the protrusion 162.

3. Third Embodiment

In the pixel 100 according to the above-described first embodiment, the light-shielding wall 160 around the through electrode 154 has a sectional shape perpendicular to the surface of the semiconductor substrate 130. The pixel 100 according to a third embodiment of the present disclosure is different from the above-described first embodiment in that the light-shielding wall 160 around the through electrode 154 has a tapered section.

Configuration of Light-Shielding Wall

Figure 8:
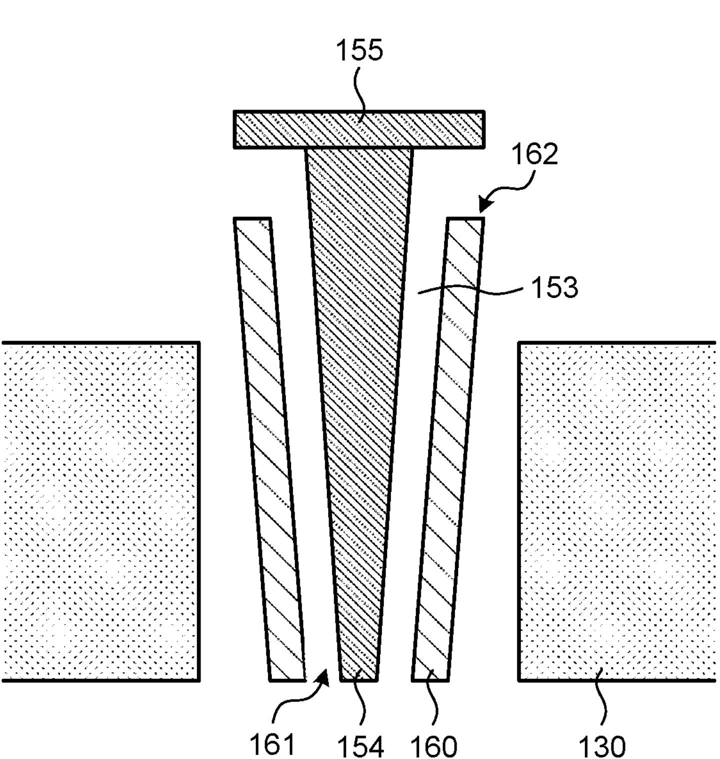
FIG. 8 is a diagram illustrating a configuration example of a light-shielding wall according to a third embodiment of the present disclosure.

FIG. 8 is a diagram illustrating a configuration example of a light-shielding wall according to the third embodiment of the present disclosure. The drawing is a diagram illustrating a configuration of the part of the light-shielding wall 160 and the through electrode 154 in the pixel 100 similarly to FIG. 5. The light-shielding wall 160, the protrusion 162, and the through electrode 154 in the drawing are different from the light-shielding wall 160, the protrusion 162, and the through electrode 154 in FIG. 5 in that they are formed to have a tapered section.

The drawing illustrates an example in which the through electrode 154 has a tapered section. As described above, the through electrode 154 may be formed by disposing a material film of the through electrode 154 in the through hole 161. The through hole 161 is configured as a hole having a deep shape with respect to the opening area. Such a through hole 161 may have a tapered section. Accordingly, the through electrode 154 is also formed to have a tapered section. Forming the light-shielding wall 160 and the protrusion 162 to have a tapered section along the outer shape of the through electrode 154 can keep the distance from the light-shielding wall 160 and the protrusion 162 to the through electrode 154 substantially constant in a depth direction of the through electrode 154. This can prevent occurrence of failures such as contact of the light-shielding wall 160 and the protrusion 162 with the through electrode 154.

The configuration of the imaging device 1 other than this is the same as the configuration of the imaging device 1 in the first embodiment of the present disclosure, and thus description thereof is omitted.

In this manner, in the imaging device 1 according to the third embodiment of the present disclosure, the distance from the light-shielding wall 160 and the protrusion 162 to the through electrode 154 having a tapered section can be kept constant by disposing the light-shielding wall 160 and the protrusion 162 having a tapered section. This can prevent a short circuit due to contact of the light-shielding wall 160 and the protrusion 162 with the through electrode 154.

4. Fourth Embodiment

The pixel 100 of the above-described first embodiment includes the protrusion 162 disposed on the back surface side of the semiconductor substrate 130. The pixel 100 according to a fourth embodiment of the present disclosure is different from that of the above-described first embodiment in including a protrusion disposed on the front surface side of a semiconductor substrate 130.

Section Configuration of Pixel

Figure 9:
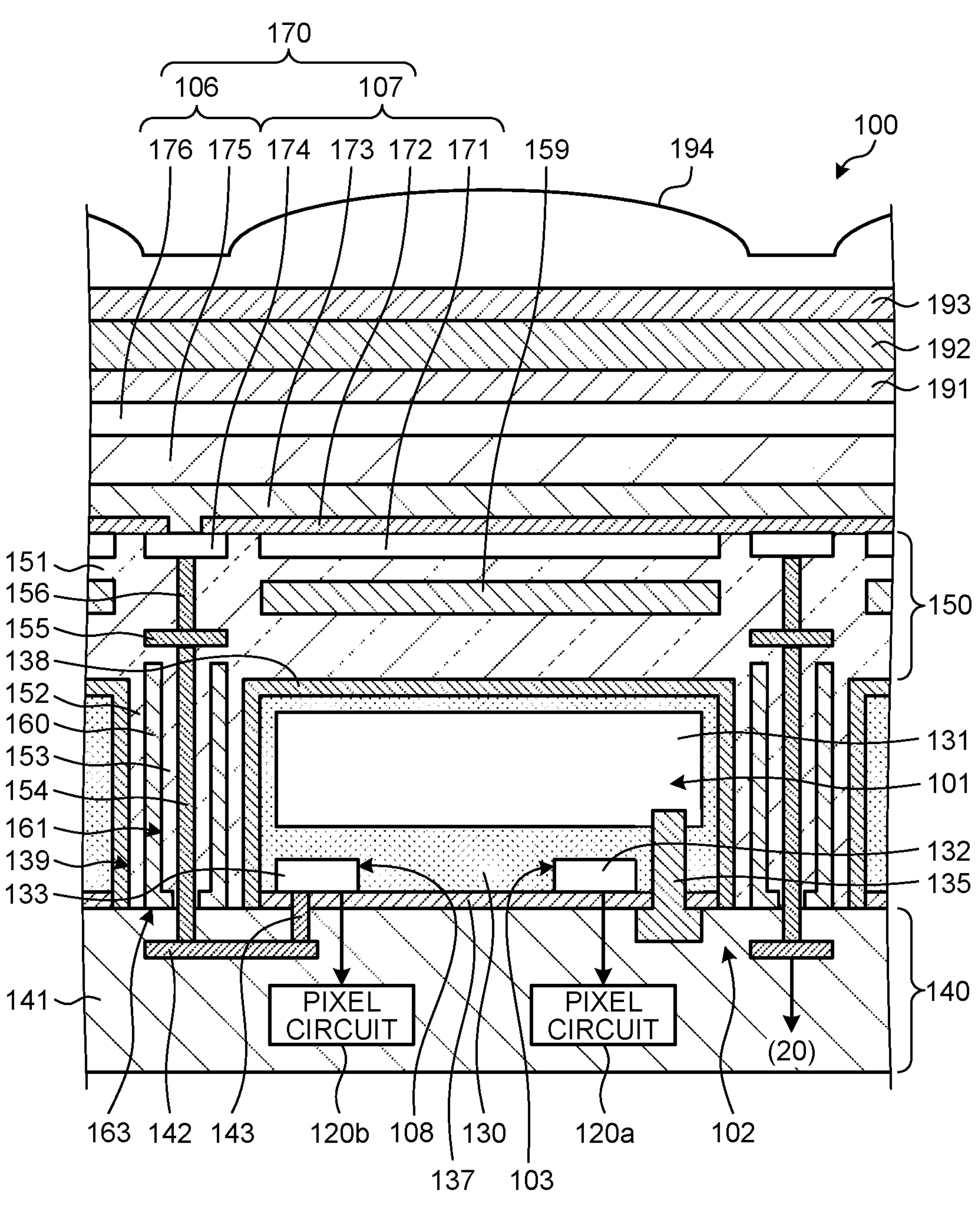
FIG. 9 is a sectional view illustrating a configuration example of a pixel according to a fourth embodiment of the present disclosure.

FIG. 9 is a sectional view illustrating a configuration example of a pixel according to the fourth embodiment of the present disclosure. This drawing is a sectional view illustrating a configuration example of the pixel 100 similarly to FIG. 4. The pixel 100 in the drawing is different from the pixel 100 in FIG. 4 in including a protrusion 163 instead of the protrusion 162.

The protrusion 163 in the drawing is a protruding region formed at an end of the light-shielding wall 160 adjacent to the opening of the through hole 161 on a side different from the side adjacent to the photoelectric conversion device 170. The protrusion 163 in the drawing is disposed on the front surface side of the semiconductor substrate 130. The protrusion 163 is formed into a shape protruding in a direction toward the through electrode 154. The protrusion 163 shields incident light passing through the inside of the through hole 161.

Configuration of Light-Shielding Wall

Figure 10:
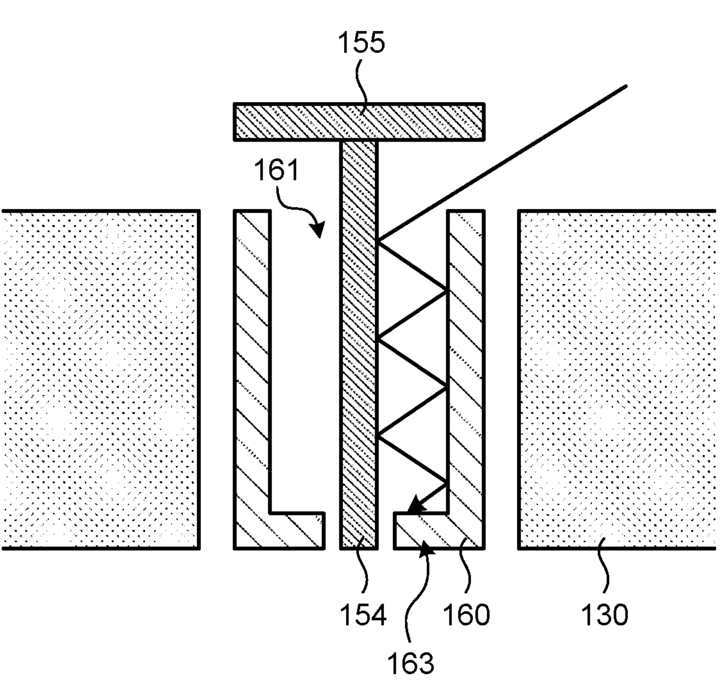
FIG. 10 is a diagram illustrating a configuration example of a light-shielding wall according to the fourth embodiment of the present disclosure.

FIG. 10 is a diagram illustrating a configuration example of a light-shielding wall according to the fourth embodiment of the present disclosure. The drawing is a diagram illustrating a configuration of the part of the light-shielding wall 160 and the through electrode 154 in the pixel 100 similarly to FIG. 5. As described above, the protrusion 163 is disposed at an end of the light-shielding wall 160 in the opening of the through hole 161 on the front surface side of the semiconductor substrate 130. The protrusion 163 may be formed into a shape surrounding the opening of the through hole 161. Disposing the protrusion 163 can shield incident light passing between the light-shielding wall 160 and the through electrode 154 in the through hole 161. The solid arrow in the drawing indicates a state of the light shielding.

Without the protrusion 163, incident light enters the wiring region 140 through the through hole 161. When the incident light is reflected by the wiring 142 or the like of the wiring region 140 and enters the photoelectric conversion unit 101 of an adjacent pixel 100, crosstalk occurs. This causes mixing of noise in an image signal. Disposing the protrusion 163 can reduce crosstalk caused by the through hole 161.

[Method for Manufacturing Imaging Device]

Figure 11A:
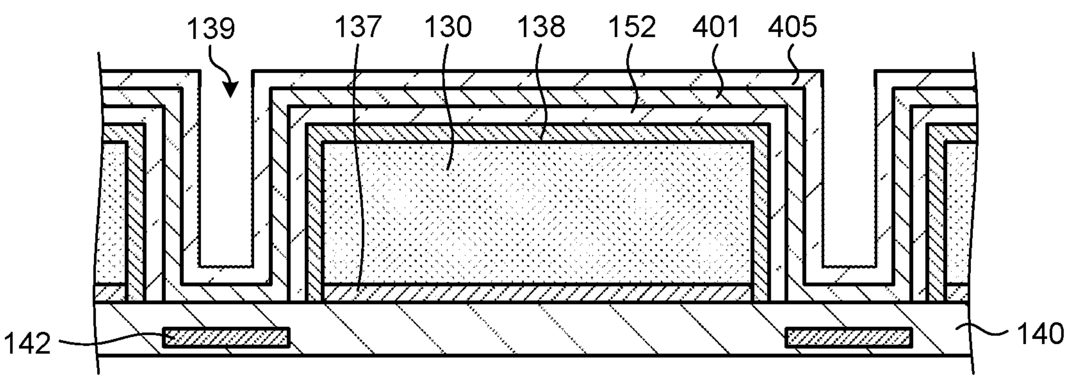
FIG. 11A is a diagram illustrating an example of a method for manufacturing the imaging device according to the fourth embodiment of the present disclosure.
Figure 11B:
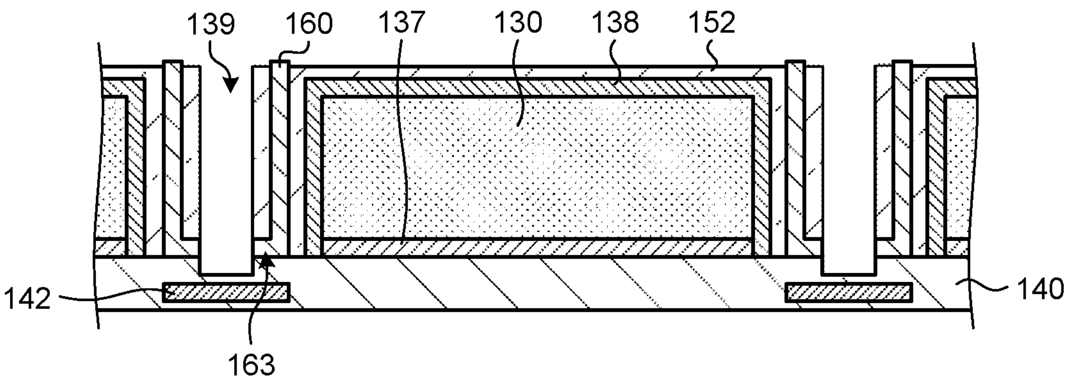
FIG. 11B is a diagram illustrating an example of the method for manufacturing the imaging device according to the fourth embodiment of the present disclosure.
Figure 11C:
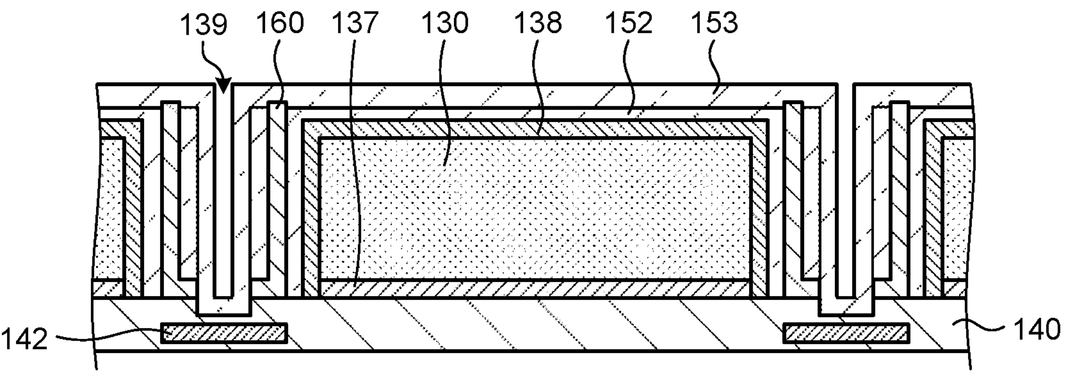
FIG. 11C is a diagram illustrating an example of the method for manufacturing the imaging device according to the fourth embodiment of the present disclosure.

FIGS. 11A, 11B, and 11C are diagrams illustrating an example of a method for manufacturing the imaging device according to the fourth embodiment of the present disclosure. FIGS. 11A, 11B, and 11C are diagrams illustrating an example of the manufacturing process of the imaging device 1 similarly to FIGS. 6A, 6B, 6C 6D, 6E, 6F, 6G, 6H, 6I, and 6J.

First, perform the steps of FIGS. 6A, 6B, 6C, and 6D. Next, dispose a material film 405 of the insulating film 153 on the back surface side of the semiconductor substrate 130 including the opening 139 (FIG. 11A).

Next, remove the material films 401 and 405 on the back surface side of the semiconductor substrate 130 and the bottom of the opening 139 (FIG. 11B). This may be performed by etching (etching back) the material films 401 and 405. The light-shielding wall 160 and the protrusion 163 may be formed through this step.

Next, dispose the insulating film 153 on the back surface side of the semiconductor substrate 130 (FIG. 11C). Thereafter, perform the steps of FIGS. 6G, 6H, 6I, and 6J, whereby the imaging device 1 may be manufactured.

The configuration of the imaging device 1 other than this is the same as the configuration of the imaging device 1 in the first embodiment of the present disclosure, and thus description thereof is omitted.

The imaging device 1 according to the fourth embodiment of the present disclosure can shield incident light passing through the through hole 161 by disposing the protrusion 163 on the light-shielding wall 160 in this manner. Crosstalk can be reduced, and mixing of noise into an image signal can be reduced.

5. Modification

In the imaging device 1 of the above-described first embodiment, the photoelectric conversion device 170 and the photoelectric conversion unit 101 perform photoelectric conversion of visible light and infrared light, respectively, but other configurations may be adopted.

Section Configuration of Pixel

Figure 12:
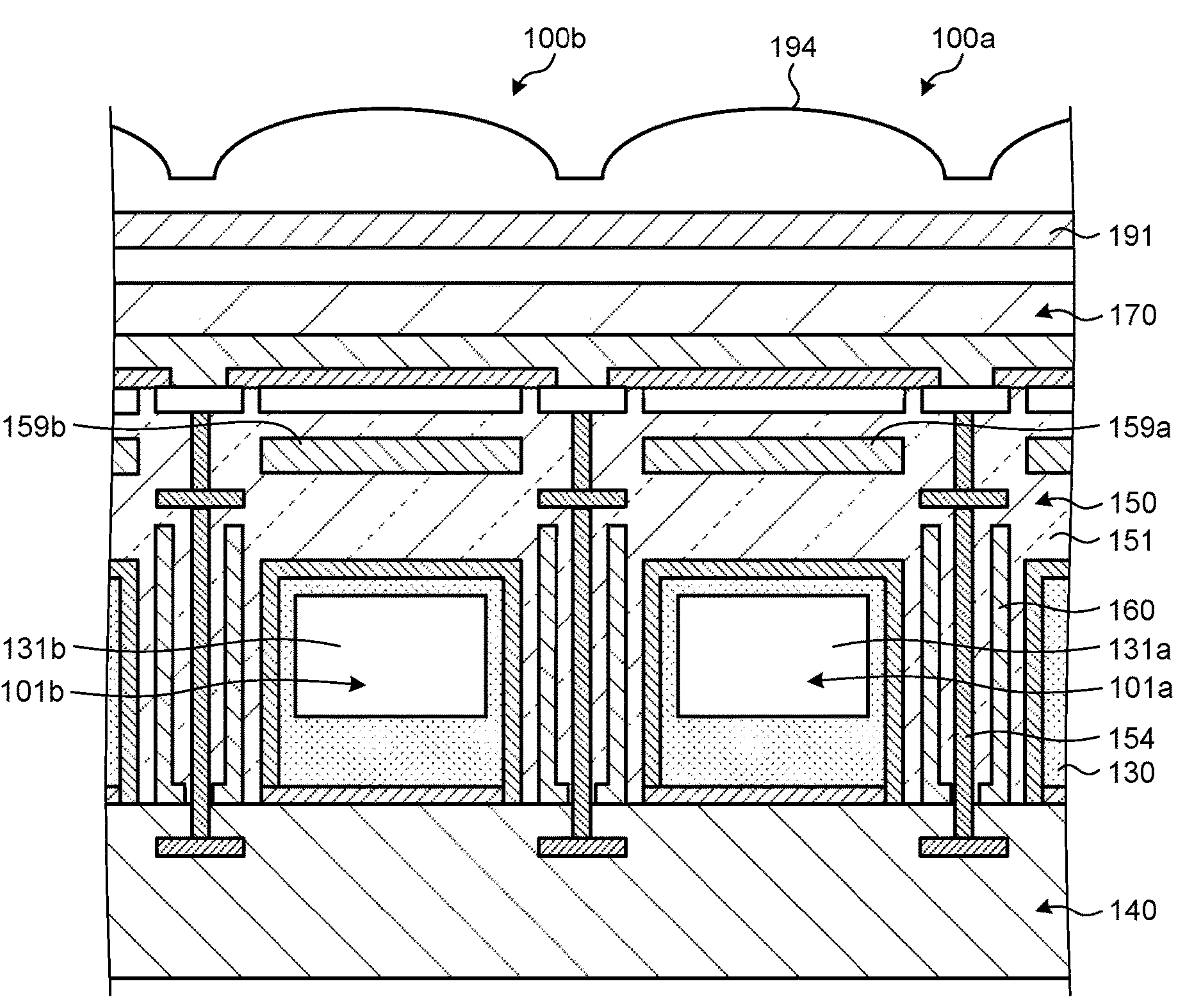
FIG. 12 is a sectional view illustrating a configuration example of a pixel according to a first modification of an embodiment of the present disclosure.

FIG. 12 is a sectional view illustrating a configuration example of a pixel according to a first modification of an embodiment of the present disclosure. This drawing is a sectional view illustrating a configuration example of the pixel 100 similarly to FIG. 4. The pixel 100 in the drawing is different from the pixel 100 in FIG. 4 in that the color filter 192 and the planarization film 193 are omitted, and the photoelectric conversion unit 101 performs photoelectric conversion of visible light.

In the drawing, pixels 100*a* and 100*b* corresponding to the pixel 100 in FIG. 4 are illustrated. The pixel 100*a* includes a photoelectric conversion unit 101*a* and a color filter 159*a*. The photoelectric conversion unit 101*a* is formed of a semiconductor region 131*a* formed in the semiconductor substrate 130. The pixel 100*b* includes a photoelectric conversion unit 101*b* and a color filter 159*b*. The photoelectric conversion unit 101*b* is formed of a semiconductor region 131*b* formed in the semiconductor substrate 130.

The photoelectric conversion device 170 is shared by the pixels 100*a* and 100*b*. The photoelectric conversion device 170 performs photoelectric conversion of visible light having a predetermined wavelength, for example, green light. Thus, in the pixels 100*a* and 100*b*, the color filter 192 may be omitted. The planarization film 193 may also be omitted accordingly.

The color filters 159*a* and 159*b* transmit visible light having a wavelength different from that of the photoelectric conversion device 170. For example, color filters that transmit red light and blue light may be used as the color filters 159*a* and 159*b*, respectively. As a result, the photoelectric conversion unit 101*a* of the pixel 100*a* performs photoelectric conversion of red light, and the photoelectric conversion unit 101*b* of the pixel 100*b* performs photoelectric conversion of blue light.

In this manner, in the imaging device 1 according to the first modification of an embodiment of the present disclosure, incident light of three colors of red light, green light, and blue light can be imaged by the two pixels 100*a* and 100*b*. Disposing the protrusion 162 and the protrusion 163 on the light-shielding wall 160 at the boundary of the pixels, it is possible to reduce crosstalk (color mixture) between the adjacent pixels 100*a* and 100*b*.

Another Section Configuration of Pixel

Figure 13:
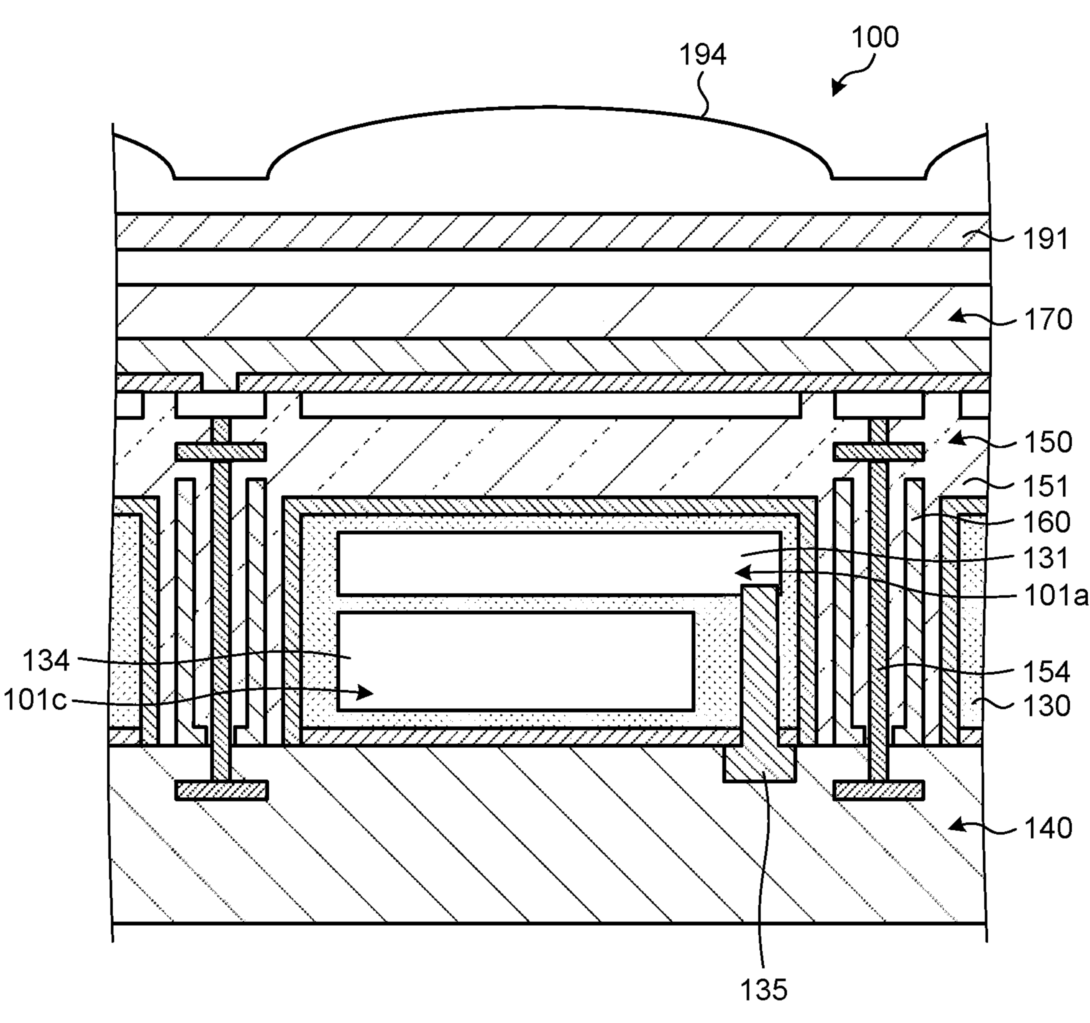
FIG. 13 is a sectional view illustrating a configuration example of a pixel according to a second modification of an embodiment of the present disclosure.

FIG. 13 is a sectional view illustrating a configuration example of a pixel according to a second modification of an embodiment of the present disclosure. This drawing is a sectional view illustrating a configuration example of the pixel 100 similarly to FIG. 4. The pixel 100 in the drawing is different from the pixel 100 in FIG. 4 in that the color filters 159 and 192 and the planarization film 193 are omitted, and a photoelectric conversion unit 101*c* is further provided. The photoelectric conversion unit corresponding to the photoelectric conversion unit 101 in FIG. 4 is distinguished by changing the reference sign to "101*a*".

The semiconductor region 131 constituting the photoelectric conversion unit 101*a* in the drawing is disposed in the vicinity of the back surface side of the semiconductor substrate 130. This causes the photoelectric conversion unit 101*a* to handle incident light having a relatively short wavelength absorbed in a shallow region of the semiconductor substrate 130. Specifically, the photoelectric conversion unit 101*a* performs photoelectric conversion of blue light.

A semiconductor region 134 constituting the photoelectric conversion unit 101*c* is disposed in the vicinity of the front surface side of the semiconductor substrate 130. Since the photoelectric conversion unit 101*c* is disposed in a deep part of the semiconductor substrate 130, the photoelectric conversion unit handles incident light having a relatively long wavelength reaching the deep part of the semiconductor substrate 130. Specifically, the photoelectric conversion unit 101*c* performs photoelectric conversion of red light. The charge transfer unit 102, the charge holding unit 103, and the pixel circuit 120 corresponding to the photoelectric conversion unit 101*c* are further disposed in the pixel 100 in the drawing.

In this manner, in the imaging device 1 according to the second modification of an embodiment of the present disclosure, incident light of three colors of red light, green light, and blue light can be imaged by the one pixel 100. Disposing the protrusion 162 and the protrusion 163 on the light-shielding wall 160 at the boundary of the pixel can reduce crosstalk (color mixture) with adjacent pixels 100.

The configuration of the imaging device 1 other than this is the same as the configuration of the imaging device 1 in the first embodiment of the present disclosure, and thus description thereof is omitted.

6. Configuration of Imaging Apparatus

The technology according to the present disclosure may be applied to various products. For example, the technology according to the present disclosure may be applied to an imaging apparatus, such as a camera.

Figure 14:
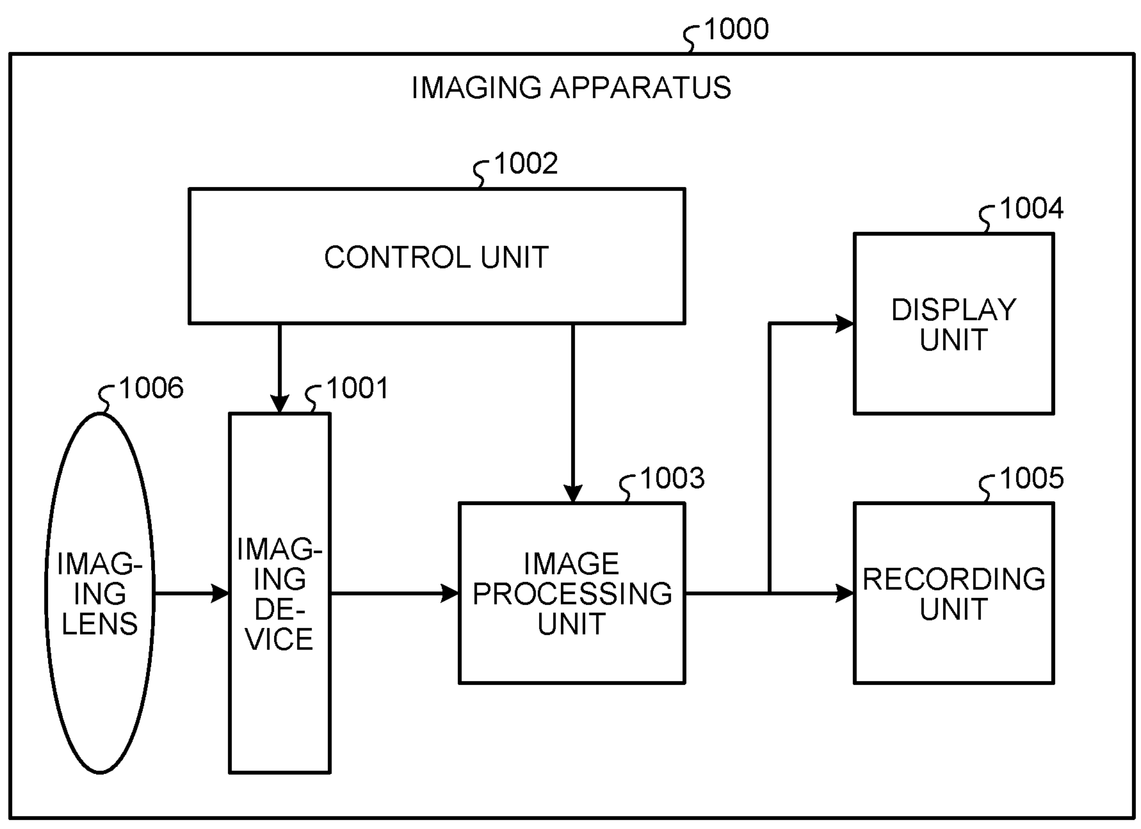
FIG. 14 is a diagram illustrating a configuration example of an imaging apparatus to which the technology according to the present disclosure may be applied.

FIG. 14 is a diagram illustrating a configuration example of an imaging apparatus to which the technology according to the present disclosure may be applied. An imaging apparatus 1000 in the drawing includes an imaging device 1001, a control unit 1002, an image processing unit 1003, a display unit 1004, a recording unit 1005, and an imaging lens 1006.

The imaging lens 1006 is a lens that collects light from a subject. The subject is imaged on a light receiving surface of the imaging device 1001 by the imaging lens 1006.

The imaging device 1001 is a device that images the subject. A plurality of pixels including a photoelectric conversion unit that performs photoelectric conversion of light from the subject are arranged on the light receiving surface of the imaging device 1001. Each of the plurality of pixels generates an image signal based on the charges generated through photoelectric conversion. The imaging device 1001 converts an image signal generated by the pixel into a digital image signal and outputs the digital image signal to the image processing unit 1003. An image signal for one screen is referred to as a frame. The imaging device 1001 may also output image signals in units of frames.

The control unit 1002 controls the imaging device 1001 and the image processing unit 1003. The control unit 1002 may be formed of an electronic circuit using a microcomputer or the like, for example.

The image processing unit 1003 processes the image signal from the imaging device 1001. The processing of the image signal in the image processing unit 1003 corresponds to, for example, demosaic processing of generating an image signal of a color that is insufficient when a color image is generated or noise reduction processing of removing noise of the image signal. The image processing unit 1003 may be formed of an electronic circuit using a microcomputer or the like, for example.

The display unit 1004 displays an image based on the image signal processed by the image processing unit 1003. The display unit 1004 may be formed of a liquid crystal monitor, for example.

The recording unit 1005 records an image (frame) based on the image signal processed by the image processing unit 1003. The recording unit 1005 may be formed of a hard disk or a semiconductor memory, for example.

The imaging apparatus to which the present disclosure may be applied has been described above. The present technology may be applied to the imaging device 1001 among the above-described components. Specifically, the imaging device 1 described in FIG. 1 may be applied to the imaging device 1001. The image processing unit 1003 is an example of a processing circuit described in the claims. The imaging apparatus 1000 is an example of an imaging apparatus described in the claims.

The configuration of the second embodiment of the present disclosure may be applied to other embodiments. Specifically, the protrusion 162 in FIG. 7 may be applied to the fourth embodiment of the present disclosure.

The configuration of the third embodiment of the present disclosure may be applied to other embodiments. Specifically, the light-shielding wall 160 in FIG. 8 may be applied to the fourth embodiment of the present disclosure.

The configuration of the fourth embodiment of the present disclosure may be applied to other embodiments. Specifically, the protrusion 163 in FIG. 9 may be applied to the second and third embodiments of the present disclosure.

Effect

An imaging device (pixel array unit 10) includes a pixel 100, a pixel circuit (pixel circuit 120*a* and the like), a light-shielding wall 160, a through electrode 154, and a protrusion. The pixel 100 includes a photoelectric conversion device 170 and a photoelectric conversion unit 101. The photoelectric conversion device 170 is disposed adjacent to the semiconductor substrate 130 and performs photoelectric conversion of incident light. The photoelectric conversion unit 101 is disposed on the semiconductor substrate 130 and performs photoelectric conversion of the incident light transmitted through the photoelectric conversion device 170. The pixel circuit (pixel circuit 120*a* and the like) is disposed on a surface of the semiconductor substrate 130 different from a surface adjacent to the photoelectric conversion device 170 and generates an image signal based on the charges generated through photoelectric conversion of each of the photoelectric conversion device 170 and the photoelectric conversion unit 101. The light-shielding wall 160 is disposed at a boundary of the pixel 100 in the semiconductor substrate 130 and shields incident light. The through electrode 154 is disposed on the light-shielding wall 160, is formed into a shape penetrating the semiconductor substrate 130, and transmits the charges generated through photoelectric conversion in the photoelectric conversion device 170 to the pixel circuit (pixel circuit 120*a* and the like). The protrusion (protrusion 162, protrusion 163) is disposed at an end of the light-shielding wall 160. Disposing the protrusion (protrusion 162, protrusion 163) on the light-shielding wall 160 can shield incident light obliquely entering from an adjacent pixel 100.

The protrusion (protrusion 162) may be disposed at the end on a side adjacent to the photoelectric conversion device 170 and formed into a shape protruding in a direction from a surface of the semiconductor substrate 130 toward the photoelectric conversion device 170. This configuration can shield incident light obliquely entering from an adjacent pixel 100 on the back surface side of the semiconductor substrate 130.

The protrusion (protrusion 162) may have a protrusion length of 5 μm or less from the surface of the semiconductor substrate 130. This configuration can reduce an increase in the film thickness of the imaging device while shielding incident light.

The imaging device may further include a color filter 159 disposed between the photoelectric conversion device 170 and the semiconductor substrate 130 in the pixel 100, wherein the protrusion (protrusion 162) may be formed into a shape surrounding the color filter 159. This configuration can shield incident light obliquely entering from an adjacent pixel 100 in the vicinity of the color filter 159.

The through electrode 154 may be disposed in a through hole 161 formed in the light-shielding wall 160.

The protrusion (protrusion 163) may be disposed at the end adjacent to an opening of the through hole 161 on a side different from the side adjacent to the photoelectric conversion device 170 and formed into a shape protruding in a direction toward the through electrode 154. This configuration can shield incident light passing through the through hole 161.

The light-shielding wall 160 may have a tapered cross section of a region adjacent to the through hole 161. This configuration can maintain a distance from the through electrode 154 having a tapered cross section.

The imaging device may further include a light-shielding film disposed in vicinity to the through hole 161 on the side adjacent to the photoelectric conversion device 170. This configuration can shield incident light entering the through hole 161.

The light-shielding wall 160 may be made of metal.

The imaging device may further include a first insulating film disposed between the light-shielding wall 160 and the semiconductor substrate 130 and a second insulating film disposed between the light-shielding wall 160 and the through electrode 154. This configuration can insulate the through electrode 154 and the light-shielding wall 160 from each other.

The imaging apparatus (imaging device 1) includes a pixel 100, a pixel circuit (pixel circuit 120*a* and the like), a light-shielding wall 160, a through electrode 154, a protrusion, and a processing circuit. The pixel 100 includes a photoelectric conversion device 170 and a photoelectric conversion unit 101. The photoelectric conversion device 170 is disposed adjacent to the semiconductor substrate 130 and performs photoelectric conversion of incident light. The photoelectric conversion unit 101 is disposed on the semiconductor substrate 130 and performs photoelectric conversion of the incident light transmitted through the photoelectric conversion device 170. The pixel circuit (pixel circuit 120*a* and the like) is disposed on a surface of the semiconductor substrate 130 different from a surface adjacent to the photoelectric conversion device 170 and generates an image signal based on the charges generated through photoelectric conversion of each of the photoelectric conversion device 170 and the photoelectric conversion unit 101. The light-shielding wall 160 is disposed at a boundary of the pixel 100 in the semiconductor substrate 130 and shields incident light. The through electrode 154 is disposed on the light-shielding wall 160, is formed into a shape penetrating the semiconductor substrate 130, and transmits the charges generated through photoelectric conversion in the photoelectric conversion device 170 to the pixel circuit (pixel circuit 120*a* and the like). The protrusion is disposed at an end of the light-shielding wall 160. The processing circuit (column signal processing unit 30) processes the generated image signal. Disposing the protrusion (protrusion 162, protrusion 163) on the light-shielding wall 160 can shield incident light obliquely entering from an adjacent pixel 100.

The effects described in the present specification are merely examples and are not restrictive of the disclosure herein, and other effects may be achieved.

The present technology may also take the following configurations.

(1)

An imaging device comprising:

a pixel including a first photoelectric conversion unit that is disposed adjacent to a semiconductor substrate and performs photoelectric conversion of incident light and a second photoelectric conversion unit that is disposed on the semiconductor substrate and performs photoelectric conversion of the incident light transmitted through the first photoelectric conversion unit;

a pixel circuit that is disposed on a surface of the semiconductor substrate different from a surface adjacent to the first photoelectric conversion unit and generates an image signal based on charges generated through photoelectric conversion of each of the first photoelectric conversion unit and the second photoelectric conversion unit;

a light-shielding wall that is disposed at a boundary of the pixel in the semiconductor substrate and shields incident light;

a through electrode that is disposed on the light-shielding wall, is formed into a shape penetrating the semiconductor substrate, and transmits charges generated through photoelectric conversion in the first photoelectric conversion unit to the pixel circuit; and a protrusion disposed at an end of the light-shielding wall.

(2)

The imaging device according to the above (1), wherein the protrusion is disposed at the end on a side adjacent to the first photoelectric conversion unit and is formed into a shape protruding in a direction from a surface of the semiconductor substrate toward the first photoelectric conversion unit.

(3)

The imaging device according to the above (2), wherein the protrusion has a protrusion length of 5 μm or less from the surface of the semiconductor substrate.

(4)

The imaging device according to the above (2) or (3), further comprising a color filter disposed between the first photoelectric conversion unit and the semiconductor substrate in the pixel, wherein the protrusion is formed into a shape surrounding the color filter.

(5)

The imaging device according to any one of the above (1) to (4), wherein the through electrode is disposed in a through hole formed in the light-shielding wall.

(6)

The imaging device according to the above (5), wherein the protrusion is disposed at the end adjacent to an opening of the through hole on a side different from the side adjacent to the first photoelectric conversion unit and is formed into a shape protruding in a direction toward the through electrode.

(7)

The imaging device according to the above (5), wherein the light-shielding wall has a tapered cross section of a region adjacent to the through hole.

(8)

The imaging device according to the above (5), further comprising a light-shielding film disposed in vicinity to the through hole on the side adjacent to the first photoelectric conversion unit.

(9)

The imaging device according to any one of the above (1) to (8), wherein the light-shielding wall is made of metal.

(10)

The imaging device according to the above (9), further comprising:

a first insulating film disposed between the light-shielding wall and the semiconductor substrate; and a second insulating film disposed between the light-shielding wall and the through electrode.

(11)

An imaging apparatus comprising:

a pixel including a first photoelectric conversion unit that is disposed adjacent to a semiconductor substrate and performs photoelectric conversion of incident light and a second photoelectric conversion unit that is disposed on the semiconductor substrate and performs photoelectric conversion of the incident light transmitted through the first photoelectric conversion unit;

a pixel circuit that is disposed on a surface of the semiconductor substrate different from a surface adjacent to the first photoelectric conversion unit and generates an image signal based on charges generated through photoelectric conversion of each of the first photoelectric conversion unit and the second photoelectric conversion unit;

a light-shielding wall that is disposed at a boundary of the pixel in the semiconductor substrate and shields incident light;

a through electrode that is disposed on the light-shielding wall, is formed into a shape penetrating the semiconductor substrate, and transmits charges generated through photoelectric conversion in the first photoelectric conversion unit to the pixel circuit;

a protrusion disposed at an end of the light-shielding wall; and a processing circuit that processes the generated image signal.

REFERENCE SIGNS LIST

1, 1001 IMAGING DEVICE
10 PIXEL ARRAY UNIT
30 COLUMN SIGNAL PROCESSING UNIT
100, 100*a*, 100*b* PIXEL
101, 101*a*, 101*b*, 101*c*, 106 PHOTOELECTRIC CONVERSION UNIT
102 CHARGE TRANSFER UNIT
103, 108 CHARGE HOLDING UNIT
107 SWITCHING DEVICE
120, 120*a*, 120*b* PIXEL CIRCUIT
130 SEMICONDUCTOR SUBSTRATE
137, 152, 153 INSULATING FILM
139 OPENING
151 INSULATING LAYER
154 THROUGH ELECTRODE
155 LIGHT-SHIELDING FILM
156 ELECTRODE
159, 159*a*, 159*b*, 192 COLOR FILTER
160 LIGHT-SHIELDING WALL
161 THROUGH HOLE
162, 163 PROTRUSION
170 PHOTOELECTRIC CONVERSION DEVICE
1000 IMAGING APPARATUS
1003 IMAGE PROCESSING UNIT

The invention claimed is:

1. An imaging device, comprising:
a pixel including a first photoelectric conversion unit and a second photoelectric conversion unit, wherein
the first photoelectric conversion unit is adjacent to a first surface of a semiconductor substrate,
the first photoelectric conversion unit is configured to:
perform photoelectric conversion of incident light;
generate a first charge based on the photoelectric conversion of the incident light; and
transmit the incident light to the second photoelectric conversion unit,
the second photoelectric conversion unit is in the semiconductor substrate, and
the second photoelectric conversion unit is configured to:
perform photoelectric conversion of the incident light transmitted by the first photoelectric conversion unit; and
generate a second charge based on the photoelectric conversion of the incident light;
a pixel circuit on a second surface of the semiconductor substrate, wherein
the second surface of the semiconductor substrate is different from the first surface of the semiconductor substrate, and
the pixel circuit is configured to generate an image signal based on each of the generated first charge and the generated second charge;
a light-shielding wall at a boundary of the pixel in the semiconductor substrate, wherein
the light-shielding wall is configured to shield the incident light, and
the light-shielding wall comprises a metal;
a first insulating film between the light-shielding wall and the semiconductor substrate;
a through electrode on the light-shielding wall, wherein
the through electrode is configured to transmit each of the generated first charge and the generated second charge to the pixel circuit, and
the through electrode penetrates the semiconductor substrate;
a second insulating film between the light-shielding wall and the through electrode; and
a protrusion at an end of the light-shielding wall.

2. The imaging device according to claim 1, wherein
the protrusion is at the end on a side adjacent to the first photoelectric conversion unit, and
the protrusion protrudes in a direction from the first surface of the semiconductor substrate toward the first photoelectric conversion unit.

3. The imaging device according to claim 2, wherein a protrusion length of the protrusion from the first surface of the semiconductor substrate is 5 μm or less.

4. The imaging device according to claim 2, further comprising a color filter between the first photoelectric conversion unit and the semiconductor substrate in the pixel, wherein the protrusion surrounds the color filter.

5. The imaging device according to claim 1, wherein the through electrode is in a through hole that is in the light-shielding wall.

6. The imaging device according to claim 5, wherein
the protrusion is adjacent to an opening of the through hole on a side different from a side adjacent to the first photoelectric conversion unit, and
the protrusion protrudes in a direction toward the through electrode.

7. The imaging device according to claim 5, wherein the light-shielding wall has a tapered cross section of a region adjacent to the through hole.

8. The imaging device according to claim 5, further comprising a light-shielding film in vicinity to the through hole on a side adjacent to the first photoelectric conversion unit.

9. An imaging apparatus, comprising:
a pixel including a first photoelectric conversion unit and a second photoelectric conversion unit, wherein
the first photoelectric conversion unit is adjacent to a first surface of a semiconductor substrate,
the first photoelectric conversion unit is configured to:
perform photoelectric conversion of incident light;
generate a first charge based on the photoelectric conversion of the incident light; and
transmit the incident light to the second photoelectric conversion unit,
the second photoelectric conversion unit is in the semiconductor substrate, and
the second photoelectric conversion unit is configured to:

perform photoelectric conversion of the incident light transmitted by the first photoelectric conversion unit; and generate a second charge based on the photoelectric conversion of the incident light;

a pixel circuit on a second surface of the semiconductor substrate, wherein the second surface of the semiconductor substrate is different from the first surface of the semiconductor substrate, and the pixel circuit is configured to generate an image signal based on each of the generated first charge and the generated second charge;

a light-shielding wall at a boundary of the pixel in the semiconductor substrate, wherein the light-shielding wall is configured to shield the incident light, and the light-shielding wall comprises a metal;

a first insulating film between the light-shielding wall and the semiconductor substrate;

a through electrode on the light-shielding wall, wherein the through electrode is configured to transmit each of the generated first charge and the generated second charge to the pixel circuit, and the through electrode penetrates the semiconductor substrate;

a second insulating film between the light-shielding wall and the through electrode;

a protrusion at an end of the light-shielding wall; and a processing circuit configured to process the generated image signal.

* * * * *